US010719638B2

(12) United States Patent
Xu et al.

(10) Patent No.: US 10,719,638 B2
(45) Date of Patent: Jul. 21, 2020

(54) DELINEATING MANAGEMENT ZONES BASED ON HISTORICAL YIELD MAPS

(71) Applicant: THE CLIMATE CORPORATION, San Francisco, CA (US)

(72) Inventors: Lijuan Xu, San Francisco, CA (US); Anahita Hassanzadeh, San Francisco, CA (US)

(73) Assignee: THE CLIMATE CORPORATION, San Francisco, CA (US)

( * ) Notice: Subject to any disclaimer, the term of this patent is extended or adjusted under 35 U.S.C. 154(b) by 832 days.

(21) Appl. No.: 15/234,943

(22) Filed: Aug. 11, 2016

(65) Prior Publication Data

US 2018/0046735 A1  Feb. 15, 2018

(51) Int. Cl.
*G06F 30/20* (2020.01)
*G06Q 50/02* (2012.01)
(Continued)

(52) U.S. Cl.
CPC ............... *G06F 30/20* (2020.01); *G06F 7/02* (2013.01); *G06Q 10/063* (2013.01); *G06Q 10/10* (2013.01); *G06Q 50/02* (2013.01)

(58) Field of Classification Search
CPC ..... G06F 17/5009; G06F 7/02; G06Q 10/063; G06Q 10/10; G06Q 50/02
See application file for complete search history.

(56) References Cited

U.S. PATENT DOCUMENTS 6,058,351 A    5/2000 McCauley
2010/0134489 A1  6/2010 Lee et al.
(Continued)

FOREIGN PATENT DOCUMENTS

WO   WO 2014/036281 A2   3/2014

OTHER PUBLICATIONS

Russ et al., "Exploratory Hierarchical Clustering for Management Zone Delineation in Precision Agriculture," in Industrial Conf. Data Mining 161-173, Springer, Berlin, Heidelberg (2011). (Year: 2011).*
(Continued)

*Primary Examiner* — Kamran Afshar
*Assistant Examiner* — Ryan C Vaughn
(74) *Attorney, Agent, or Firm* — Hickman Palermo; Becker Bingham LLP; Malgorzata A. Kulczycka

(57) ABSTRACT

In an embodiment, a method comprises: receiving digital yield data representing yields of crops that have been harvested from an agricultural field; applying an empirical cumulative density function to the digital yield data to generate transformed digital yield data; smoothing the transformed digital yield data to result in generating and storing smooth transformed digital yield data; determining a first count value for a plurality of management classes; generating a plurality of first management zones for the agricultural field by clustering the smooth transformed digital yield data and using the first count value; generating a set of first merged management zones by merging one or more small management zones of the plurality of first management zones with their respective similar neighboring large zones; and storing the set of first merged management zones and the first count value in a set of management zone metrics.

19 Claims, 9 Drawing Sheets

(51) Int. Cl.
G06Q 10/06 (2012.01)
G06Q 10/10 (2012.01)
G06F 7/02 (2006.01)

(56) References Cited

U.S. PATENT DOCUMENTS

2013/0018586 A1  1/2013  Peterson et al.
2013/0066666 A1  3/2013  Anderson et al.
2014/0058763 A1*  2/2014  Zizzamia .............. G06Q 40/08
                                                        705/4

OTHER PUBLICATIONS

Brock et al., "Defining Yield-Based Management Zones for Corn-Soybean Rotations," in 97 Agronomy J. 1115-1128 (2005). (Year: 2005).*

Simbahan et al., "Screening Yield Monitor Data Improves Grain Yield Maps," in 96.4 Agronomy J. 1091-1102 (2004). (Year: 2004).*

Russ et al., "Machine Learning Methods for Spatial Clustering on Precision Agriculture Data," in 11 SCAI 40-49 (2011). (Year: 2011).*

Russ et al., "Hierarchical Spatial Clustering for Management Zone Delineation in Precision Agriculture," in Ind. Conf. Data Mining-Workshops 95-104 (2010). (Year: 2010).*

King et al., "Mapping Potential Crop Management Zones within Fields: Use of Yield-map Series and Patterns of Soil Physical Properties Identified by Electromagnetic Induction Sensing," in 6 Precision Agriculture 167-181 (2005). (Year: 2005).*

Franzen et al., "Use of Data Layering to Address Changes in Nitrogen Management Zone Delineation," in 42 Monitoring Science and Technology Symposium: Unifying Knowledge for Sustainability in the Western Hemisphere Proceedings RMRS-P-42CD 344-349. (Year: 2006).*

Fridgen et al., "Management Zone Analyst (MZA): Software for Subfield Management Zone Delineation," in 96 Agronomy J. 100-108 (2004). (Year: 2004).*

Jaynes et al., "Cluster Analysis of Spatiotemporal Corn Yield Patterns in an Iowa Field," in 95 Agronomy J. 574-586 (2003). (Year: 2003).*

Kitchen et al., "Delineating Productivity Zones on Claypan Soil Fields Using Apparent Soil Electrical Conductivity," in 46 Comp. Electronics in Agriculture 285-308 (2005). (Year: 2005).*

Li et al., "Delineation of Site-Specific Management Zones Based on Temporal and Spatial Variability of Soil Electrical Conductivity," in 17 Pedosphere 156-164 (2007). (Year: 2007).*

Schepers et al., "Appropriateness of Management Zones for Characterizing Spatial Variability of Soil Properties and Irrigated Corn Yields across Years," in 96.1 Agronomy J. 195-203 (2004). (Year: 2004).*

Song et al., "The Delineation of Agricultural Management Zones with High Resolution Remotely Sensed Data," in 10 Precision Agriculture 471-487 (2009). (Year: 2009).*

Zhong et al., "Determination of Management Zones for a Tobacco Field Based on Soil Fertility," in 65 Comp. Electronics in Agriculture 168-175 (2009). (Year: 2009).*

Zucker, "Fast Seafloor Topography Extraction and Visualization from Sparse AUV Altimeter Data," in 1 Europe Oceans 2005 419-424 (2005). (Year: 2005).*

International Searching Authority, "Search Report" in application PCT/US2017/039463, dated Sep. 13, 2017, dated 13 pages.

Current Claims in application No. PCT/2017/039463, dated Sep. 2017, 5 pages.

The International Bureau of WIPO, "The International Preliminary Report on Patentability", in application No. PCT/US2017/039463, dated Feb. 12, 2019, 7 pages.

Current Claims in application No. PCT/US2017/039463, dated Feb. 2019, 5 pages.

European Patent Office, "Search Report" in application No. 173839966.3-1222 dated Dec. 19, 2019, 9 pages.

European Claims in application No. 17839966.3-1222, dated Dec. 2019, 3 pages.

\* cited by examiner

Fig. 2
(a)
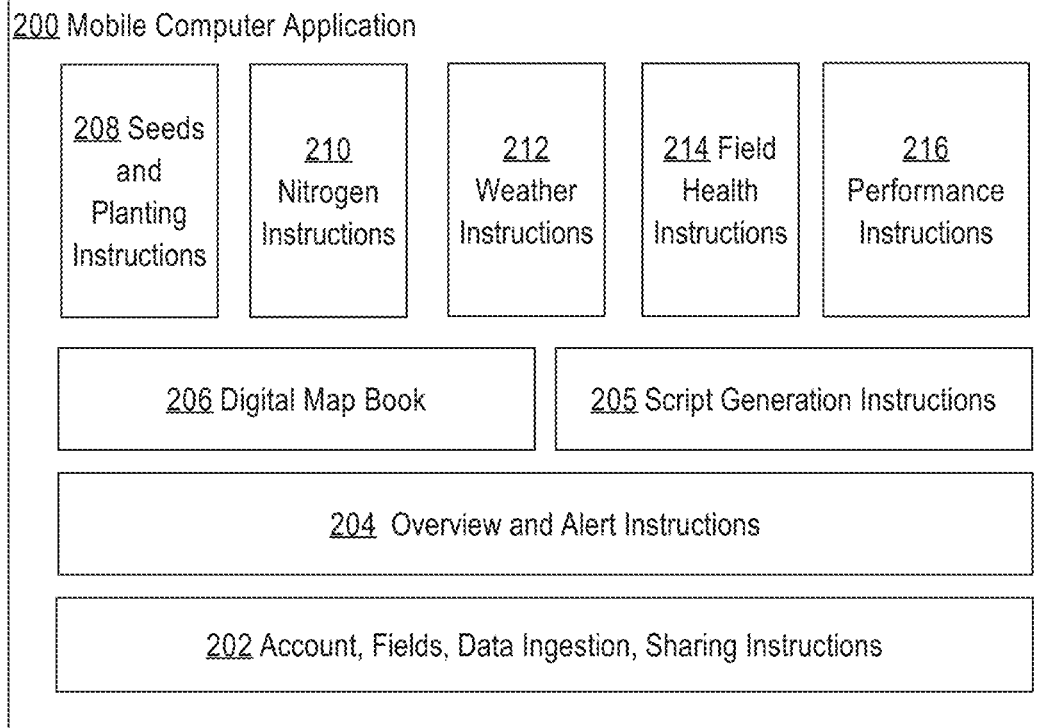
(b)
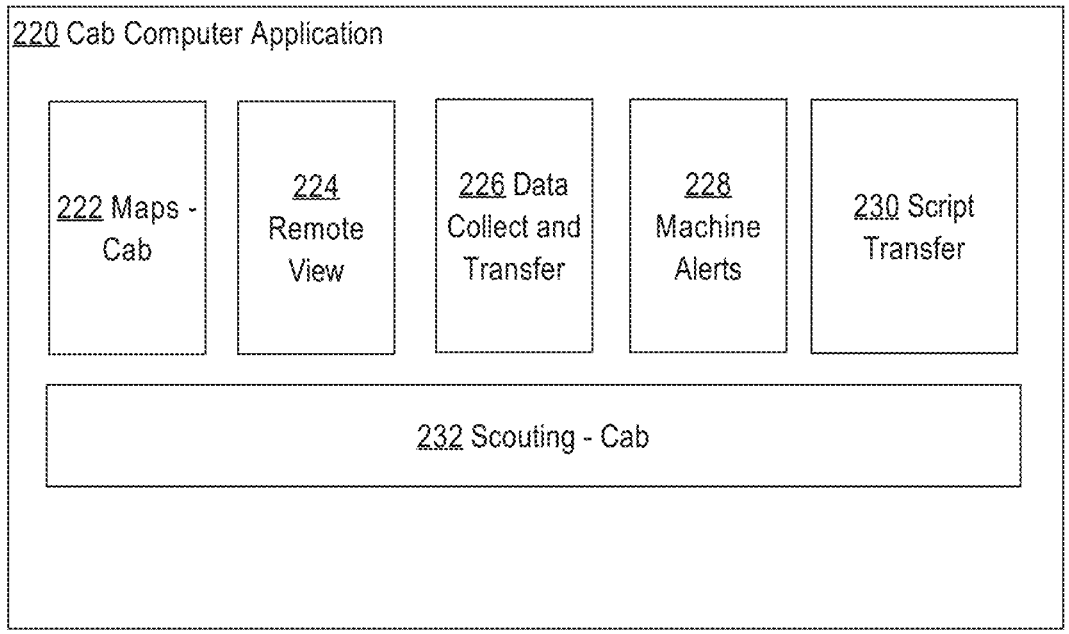

Data Manager

Nitrogen | Planting | Practices | Soil

Planting 1(4 Fields)
Crop Corn Product
Plant Date: 2016-04-12
ILU 112 | Pop: 34000
[Edit] [Apply]

Planting 2(0 Fields)
Crop Corn Product
Plant Date: 2016-04-15
ILU 83 | Pop: 34000
[Edit] [Apply]

Planting 3(0 Fields)
Crop Corn Product
Plant Date: 2016-04-13
ILU 83 | Pop: 34000
[Edit] [Apply]

Planting 4(1 Fields)
Crop Corn Product
Plant Date: 2016-04-13
ILU 112 | Pop: 34000
[Edit] [Apply]

Add New Planting Plan [+]

| | | CROP | PLANTED ACRES | PRODUCT | RELATIVE MATURITY | TARGET YIELD | POPULATION(AVG) | PLA |
|---|---|---|---|---|---|---|---|---|
| ☐ | Select All | | | | | | | |
| ☐ | Ames, IA 1<br>Corn \| 100 \| Boone, IA | Corn | — | DMC82-M | 112 | 160 | 34000 | Apr |
| ☐ | Austin, MN 1<br>Corn \| 100 \| Fredricks, MN | Corn | — | DMC82-M | 114 | 160 | 36000 | Apr |
| ☐ | Boone, IN 1<br>Corn \| 100 \| Boone, IA | Corn | — | DMC82-M | 112 | 150 | 34000 | Apr |
| ☐ | Champaign 1<br>Corn \| 100 \| Champaign, IL | Corn | — | — | 112 | 200 | 34000 | Apr |
| ☐ | E Nebraska 1<br>Corn \| 100 \| Burt, NE | Corn | — | — | 112 | 160 | 34000 | Apr |

DELINEATING MANAGEMENT ZONES BASED ON HISTORICAL YIELD MAPS

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright or rights whatsoever. © 2016 The Climate Corporation.

FIELD OF THE DISCLOSURE

The technical field of the present disclosure includes computer systems useful in agriculture and climatology. The disclosure is also in the technical field of computer systems that are programmed or configured to generate management zones for agricultural fields based on digital historical yield map data, pipelined data processing, and computer-implemented data recommendations for use in agriculture.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

Management zones refer to contiguous regions within an agricultural field that have similar limiting factors influencing harvested yields of crops. The regions that belong to the same management zone can usually be managed uniformly with respect to seeding, irrigation, application of fertilizers such as nitrogen, and/or harvesting.

One advantage of identifying management zones within an agricultural field is that information about the zones may help crop growers to customize their practices for each zone to thus increase the productivity and the harvested yields of crops.

SUMMARY

The appended claims may serve as a summary of the disclosure.

BRIEF DESCRIPTION OF THE DRAWINGS

In the drawings:

FIG. 2 illustrates two views of an example logical organization of sets of instructions in main memory when an example mobile application is loaded for execution.

FIG. 6 depicts an example embodiment of a spreadsheet view for data entry.

DETAILED DESCRIPTION

Figure 1:
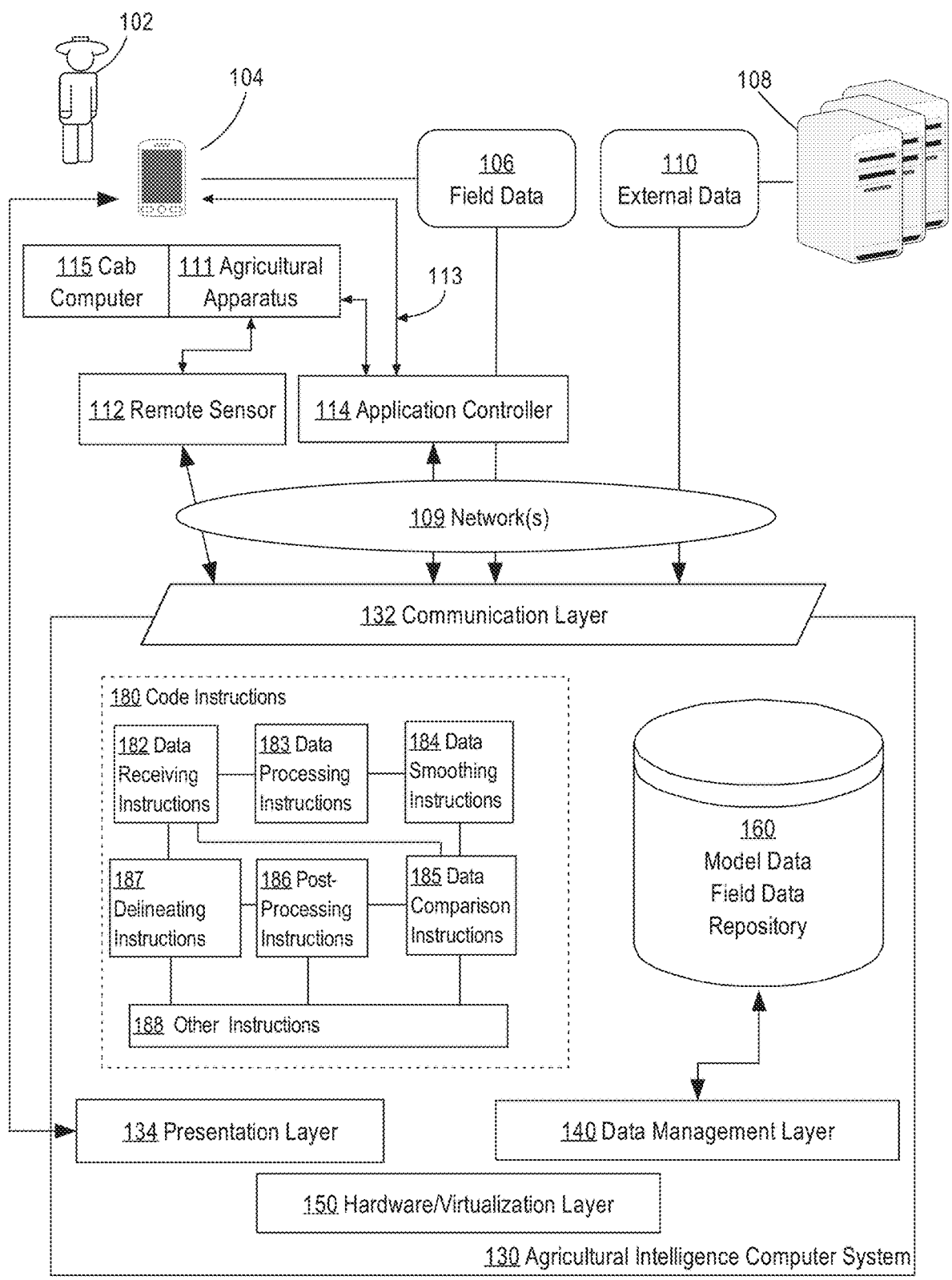
FIG. 1 illustrates an example computer system that is configured to perform the functions described herein, shown in a field environment with other apparatus with which the system may interoperate.

In the following description, for the purposes of explanation, numerous specific details are set forth in order to provide a thorough understanding of the present disclosure. It will be apparent, however, that embodiments may be practiced without these specific details. In other instances, well-known structures and devices are shown in block diagram form in order to avoid unnecessarily obscuring the present disclosure. Embodiments are disclosed in sections according to the following outline:

1. GENERAL OVERVIEW
2. EXAMPLE AGRICULTURAL INTELLIGENCE COMPUTER SYSTEM
   2.1. STRUCTURAL OVERVIEW
   2.2. APPLICATION PROGRAM OVERVIEW
   2.3. DATA INGEST TO THE COMPUTER SYSTEM
   2.4. PROCESS OVERVIEW—AGRONOMIC MODEL TRAINING
   2.5. IMPLEMENTATION EXAMPLE—HARDWARE OVERVIEW
3. IDENTIFYING MANAGEMENT ZONES BASED ON HISTORICAL YIELD DATA
   3.1 MANAGEMENT ZONES CREATING PIPELINE
   3.2 CREATING MANAGEMENT ZONES
      3.2.1 YIELD DATA
      3.2.2 PREPROCESSING OF RECEIVED DATA
      3.2.3 IMPUTING MISSING YIELD DATA
      3.2.4 EMPIRICAL CUMULATIVE DENSITY TRANSFORMATION
      3.2.5 SPATIAL SMOOTHING
      3.2.6 IDENTIFYING MANAGEMENT ZONES
         3.2.6.1 K-MEANS APPROACH
         3.2.6.2 FUZZY C-MEANS APPROACH
         3.2.6.3 REGION MERGING APPROACH
      3.2.7 POST PROCESSING
   3.3 PERFORMANCE CONSIDERATIONS
   3.4 USEFULNESS OF MANAGEMENT ZONES DELINEATION
   3.5 EXTENSIONS

1. General Overview

In an embodiment, a process of delineating management zones within agricultural field management zones includes determining contiguous subregions within the agricultural field that have similar yield limiting factors, and thus can be uniformly managed.

In an embodiment, a process of delineating management zones within an agricultural field is implemented in a computer system that comprises computer memory and one or more processors configured to execute program instructions. The process may be implemented, for example, in a computer workstation owned by a crop grower and to which the grower may provide historical yields of crops data. The process may also be implemented in a mobile device, such as a smart phone that connects to a storage device or a cloud storage system in which the historical yields of crops data are stored. Furthermore, the process may be implemented in a computer server to which the yield data are provided or to which the yield data are made available.

A zone delineation process may include using instructions programmed in a computer system to receive yield data representing yields of crops that have been harvested from an agricultural field. The yield data may include historical maps provided by crops growers, research partners, agricultural agencies, and other agricultural data sources. The yield data may comprise data representing yield information collected for one year or multiple years.

In an embodiment, received yield data are preprocessed. Preprocessing of the yield data may be performed by removing yield maps that correspond to multiple crops planted in the same season in the agricultural field, removing yield maps that include yield records outside boundaries of the agricultural field, marking yield records of absolute zeros as missing values, removing yield records for fields that have less than two years of yield maps period, or removing yield maps that have more than a certain count of missing values.

A zone delineation process may also include using the instructions to transform yield data to generate transformed yield data. Transforming the yield data may be performed by applying an empirical cumulative density function (ECDF) to the yield data to normalize the data to a certain range, such as a range of [0, 1]. The transformed yield data may be comparable across different years and types of crops. For example, the ECDF may allow transforming, or normalizing, yield records for each field and year, regardless of the crop type and the collection time, to a range of [0, 1], so that the transformed data may be comparable with each other.

In an embodiment, transformed yield data are used to generate smooth transformed yield data. Smooth transformed yield data may be generated by performing smoothing operations on the transformed yield data. That may include removing outlier data from the transformed yield data, determining missing values in the transformed yield data, computing substitute values for the missing values, or performing a spatial smoothing on the transformed yield data.

In an embodiment, a process of delineating management zones within an agricultural field includes determining a first count value for a plurality of management classes. A count of management classes is a parameter used to determine a count of distinctive management classes to be used to create the management zones. Distinctive management classes include the areas in the agricultural field that have relatively homogeneous yield limiting factors, but are not restricted to be spatially contiguous.

The smooth transformed yield data and the first count value may be used to generate a plurality of first management zones. The first management zones may be generated by applying, to the smooth transformed yield data, clustering approaches, such as a centroid-based clustering, or region merging approaches.

If a plurality of first management zones includes one or more relatively small zones, then the small zones may be merged with their neighboring larger zones. Merging the small management zones with their respective neighboring large zones results in generating a set of first merged management zones.

In an embodiment, a set of first merged management zones is used to automatically control a computer control system of one or more of seeding, irrigation, nitrogen application, and harvesting apparatus.

In an embodiment, a set of first merged management zones and a first count value are stored in a set of management metrics. The metrics may be stored in, for example, a computer memory unit, a data storage, or a cloud storage system.

The process of creating management zones may be repeated for different counts of classes. For example, the process may be repeated for the increased, or decreased, counts until a desired quality of the zone delineation is achieved.

In an embodiment, a second count value for a plurality of management classes is determined and used to generate a plurality of second management zones. The plurality of second management zones may be generated by applying the same approaches as those used to generate a plurality of first management zones. The approaches may include clustering approaches, such as a centroid-based clustering, and region merging approaches.

If a plurality of second management zones includes one or more relatively small zones, then the small zones may be merged with their corresponding neighboring larger zones to generate a set of second merged management zones. The set of second merged management zones and the second count value may be stored as metrics of management zones.

In an embodiment, recommendations are generated based on the metrics of management zones. The recommendations may be generated by evaluating a delineation quality of management zones stored in the metrics. The recommendations may include information about the created management zones and a recommended class count for the plurality of management classes. The recommendations may be sent to crop growers to help them to determine, for example, seeding schedules for the field.

2. Example Agricultural Intelligence Computer System

2.1 Structural Overview

FIG. 1 illustrates an example computer system that is configured to perform the functions described herein, shown in a field environment with other apparatus with which the system may interoperate. In one embodiment, a user 102 owns, operates or possesses a field manager computing device 104 in a field location or associated with a field location such as a field intended for agricultural activities or a management location for one or more agricultural fields. The field manager computer device 104 is programmed or configured to provide field data 106 to an agricultural intelligence computer system 130 via one or more networks 109.

Examples of field data 106 include (a) identification data (for example, acreage, field name, field identifiers, geographic identifiers, boundary identifiers, crop identifiers, and any other suitable data that may be used to identify farm land, such as a common land unit (CLU), lot and block number, a parcel number, geographic coordinates and boundaries, Farm Serial Number (FSN), farm number, tract number, field number, section, township, and/or range), (b) harvest data (for example, crop type, crop variety, crop rotation, whether the crop is grown organically, harvest date, Actual Production History (APH), expected yield, yield, crop price, crop revenue, grain moisture, tillage practice, and previous growing season information), (c) soil data (for example, type, composition, pH, organic matter (OM), cation exchange capacity (CEC)), (d) planting data (for example, planting date, seed(s) type, relative maturity (RM) of planted seed(s), seed population), (e) fertilizer data (for example, nutrient type (Nitrogen, Phosphorous, Potassium), application type, application date, amount, source, method), (f) pesticide data (for example, pesticide, herbicide, fungicide, other substance or mixture of substances intended for use as a plant regulator, defoliant, or desiccant, application date, amount, source, method), (g) irrigation data (for example, application date, amount, source, method), (h) weather data (for example, precipitation, rainfall rate, predicted rainfall, water runoff rate region, temperature, wind, forecast, pressure, visibility, clouds, heat index, dew point, humidity, snow depth, air quality, sunrise, sunset), (i) imagery data (for example, imagery and light spectrum information from an agricultural apparatus sensor, camera, computer, smartphone, tablet, unmanned aerial vehicle, planes or satellite), (j) scouting observations (photos, videos, free form notes, voice recordings, voice transcriptions, weather conditions (temperature, precipitation (current and over time), soil moisture, crop growth stage, wind velocity, relative humidity, dew point, black layer)), and (k) soil, seed, crop phenology, pest and disease reporting, and prediction sources and databases.

A data server computer 108 is communicatively coupled to agricultural intelligence computer system 130 and is programmed or configured to send external data 110 to agricultural intelligence computer system 130 via the network(s) 109. The external data server computer 108 may be owned or operated by the same legal person or entity as the agricultural intelligence computer system 130, or by a different person or entity such as a government agency, non-governmental organization (NGO), and/or a private data service provider. Examples of external data include weather data, imagery data, soil data, or statistical data relating to crop yields, among others. External data 110 may consist of the same type of information as field data 106. In some embodiments, the external data 110 is provided by an external data server 108 owned by the same entity that owns and/or operates the agricultural intelligence computer system 130. For example, the agricultural intelligence computer system 130 may include a data server focused exclusively on a type of data that might otherwise be obtained from third party sources, such as weather data. In some embodiments, an external data server 108 may actually be incorporated within the system 130.

An agricultural apparatus 111 may have one or more remote sensors 112 fixed thereon, which sensors are communicatively coupled either directly or indirectly via agricultural apparatus 111 to the agricultural intelligence computer system 130 and are programmed or configured to send sensor data to agricultural intelligence computer system 130. Examples of agricultural apparatus 111 include tractors, combines, harvesters, planters, trucks, fertilizer equipment, unmanned aerial vehicles, and any other item of physical machinery or hardware, typically mobile machinery, and which may be used in tasks associated with agriculture. In some embodiments, a single unit of apparatus 111 may comprise a plurality of sensors 112 that are coupled locally in a network on the apparatus; a controller area network (CAN) is example of such a network that can be installed in combines or harvesters. Application controller 114 is communicatively coupled to agricultural intelligence computer system 130 via the network(s) 109 and is programmed or configured to receive one or more scripts to control an operating parameter of an agricultural vehicle or implement from the agricultural intelligence computer system 130. For instance, a controller area network (CAN) bus interface may be used to enable communications from the agricultural intelligence computer system 130 to the agricultural apparatus 111, such as how the CLIMATE FIELDVIEW DRIVE, available from The Climate Corporation, San Francisco, Calif., is used. Sensor data may consist of the same type of information as field data 106. In some embodiments, remote sensors 112 may not be fixed to an agricultural apparatus 111 but may be remotely located in the field and may communicate with network 109.

The apparatus 111 may comprise a cab computer 115 that is programmed with a cab application, which may comprise a version or variant of the mobile application for device 104 that is further described in other sections herein. In an embodiment, cab computer 115 comprises a compact computer, often a tablet-sized computer or smartphone, with a graphical screen display, such as a color display, that is mounted within an operator's cab of the apparatus 111. Cab computer 115 may implement some or all of the operations and functions that are described further herein for the mobile computer device 104.

The network(s) 109 broadly represent any combination of one or more data communication networks including local area networks, wide area networks, internetworks or internets, using any of wireline or wireless links, including terrestrial or satellite links. The network(s) may be implemented by any medium or mechanism that provides for the exchange of data between the various elements of FIG. 1. The various elements of FIG. 1 may also have direct (wired or wireless) communications links. The sensors 112, controller 114, external data server computer 108, and other elements of the system each comprise an interface compatible with the network(s) 109 and are programmed or configured to use standardized protocols for communication across the networks such as TCP/IP, Bluetooth, CAN protocol and higher-layer protocols such as HTTP, TLS, and the like.

Agricultural intelligence computer system 130 is programmed or configured to receive field data 106 from field manager computing device 104, external data 110 from external data server computer 108, and sensor data from remote sensor 112. Agricultural intelligence computer system 130 may be further configured to host, use or execute one or more computer programs, other software elements, digitally programmed logic such as FPGAs or ASICs, or any combination thereof to perform translation and storage of data values, construction of digital models of one or more crops on one or more fields, generation of recommendations and notifications, and generation and sending of scripts to application controller 114, in the manner described further in other sections of this disclosure.

In an embodiment, agricultural intelligence computer system 130 is programmed with or comprises a communication layer 132, presentation layer 134, data management layer 140, hardware/virtualization layer 150, and model and field data repository 160. "Layer," in this context, refers to any combination of electronic digital interface circuits, microcontrollers, firmware such as drivers, and/or computer programs or other software elements.

Communication layer 132 may be programmed or configured to perform input/output interfacing functions including sending requests to field manager computing device 104, external data server computer 108, and remote sensor 112 for field data, external data, and sensor data respectively. Communication layer 132 may be programmed or configured to send the received data to model and field data repository 160 to be stored as field data 106.

In an embodiment, agricultural intelligence computer system 130 is programmed with or comprises code instructions 180. For example, code instructions 180 may include data receiving instructions 182 which are programmed for receiving, over network(s) 109, electronic digital data comprising yield data. Code instructions 180 may also include data processing instructions 183 which are programmed for preprocessing of the received yield data; data smoothing instructions 184 which are programmed for smoothing the preprocessed yield data; data delineating instructions 187 which are programmed for delineating management zones; post-processing instructions 186 which are programmed for post-processing of the delineated management zones; data comparison instructions 185 which are programmed for comparing the post-processed management zones; and other detection instructions 188.

Presentation layer 134 may be programmed or configured to generate a graphical user interface (GUI) to be displayed on field manager computing device 104, cab computer 115 or other computers that are coupled to the system 130 through the network 109. The GUI may comprise controls for inputting data to be sent to agricultural intelligence computer system 130, generating requests for models and/or recommendations, and/or displaying recommendations, notifications, models, and other field data.

Data management layer 140 may be programmed or configured to manage read operations and write operations involving the repository 160 and other functional elements of the system, including queries and result sets communicated between the functional elements of the system and the repository. Examples of data management layer 140 include JDBC, SQL server interface code, and/or HADOOP interface code, among others. Repository 160 may comprise a database. As used herein, the term "database" may refer to either a body of data, a relational database management system (RDBMS), or to both. As used herein, a database may comprise any collection of data including hierarchical databases, relational databases, flat file databases, object-relational databases, object-oriented databases, and any other structured collection of records or data that is stored in a computer system. Examples of RDBMS's include, but are not limited to including, ORACLE®, MYSQL, IBM® DB2, MICROSOFT® SQL SERVER, SYBASE®, and POSTGRESQL databases. However, any database may be used that enables the systems and methods described herein.

When field data 106 is not provided directly to the agricultural intelligence computer system via one or more agricultural machines or agricultural machine devices that interacts with the agricultural intelligence computer system, the user may be prompted via one or more user interfaces on the user device (served by the agricultural intelligence computer system) to input such information. In an example embodiment, the user may specify identification data by accessing a map on the user device (served by the agricultural intelligence computer system) and selecting specific CLUs that have been graphically shown on the map. In an alternative embodiment, the user 102 may specify identification data by accessing a map on the user device (served by the agricultural intelligence computer system 130) and drawing boundaries of the field over the map. Such CLU selection or map drawings represent geographic identifiers. In alternative embodiments, the user may specify identification data by accessing field identification data (provided as shape files or in a similar format) from the U. S. Department of Agriculture Farm Service Agency or other source via the user device and providing such field identification data to the agricultural intelligence computer system.

In an example embodiment, the agricultural intelligence computer system 130 is programmed to generate and cause displaying a graphical user interface comprising a data manager for data input. After one or more fields have been identified using the methods described above, the data manager may provide one or more graphical user interface widgets which when selected can identify changes to the field, soil, crops, tillage, or nutrient practices. The data manager may include a timeline view, a spreadsheet view, and/or one or more editable programs.

Figure 5:
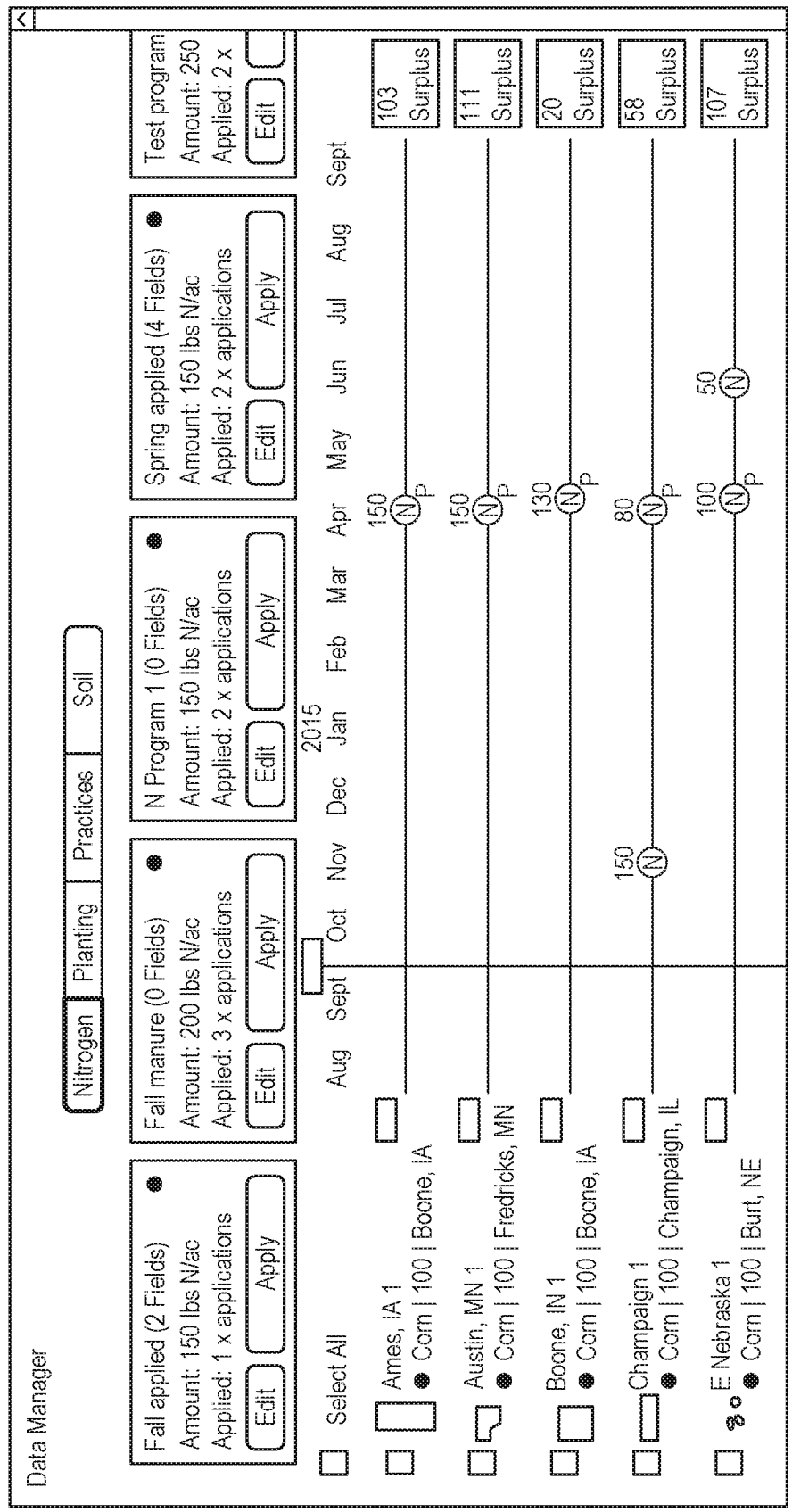
FIG. 5 depicts an example embodiment of a timeline view for data entry.

FIG. 5 depicts an example embodiment of a timeline view for data entry. Using the display depicted in FIG. 5, a user computer can input a selection of a particular field and a particular date for the addition of event. Events depicted at the top of the timeline may include Nitrogen, Planting, Practices, and Soil. To add a nitrogen application event, a user computer may provide input to select the nitrogen tab. The user computer may then select a location on the timeline for a particular field in order to indicate an application of nitrogen on the selected field. In response to receiving a selection of a location on the timeline for a particular field, the data manager may display a data entry overlay, allowing the user computer to input data pertaining to nitrogen applications, planting procedures, soil application, tillage procedures, irrigation practices, or other information relating to the particular field. For example, if a user computer selects a portion of the timeline and indicates an application of nitrogen, then the data entry overlay may include fields for inputting an amount of nitrogen applied, a date of application, a type of fertilizer used, and any other information related to the application of nitrogen.

In an embodiment, the data manager provides an interface for creating one or more programs. "Program," in this context, refers to a set of data pertaining to nitrogen applications, planting procedures, soil application, tillage procedures, irrigation practices, or other information that may be related to one or more fields, and that can be stored in digital data storage for reuse as a set in other operations. After a program has been created, it may be conceptually applied to one or more fields and references to the program may be stored in digital storage in association with data identifying the fields. Thus, instead of manually entering identical data relating to the same nitrogen applications for multiple different fields, a user computer may create a program that indicates a particular application of nitrogen and then apply the program to multiple different fields. For example, in the timeline view of FIG. 5, the top two timelines have the "Fall applied" program selected, which includes an application of 150 lbs. N/ac in early April. The data manager may provide an interface for editing a program. In an embodiment, when a particular program is edited, each field that has selected the particular program is edited. For example, in FIG. 5, if the "Fall applied" program is edited to reduce the application of nitrogen to 130 lbs. N/ac, the top two fields may be updated with a reduced application of nitrogen based on the edited program.

In an embodiment, in response to receiving edits to a field that has a program selected, the data manager removes the correspondence of the field to the selected program. For example, if a nitrogen application is added to the top field in FIG. 5, the interface may update to indicate that the "Fall applied" program is no longer being applied to the top field. While the nitrogen application in early April may remain, updates to the "Fall applied" program would not alter the April application of nitrogen.

FIG. 6 depicts an example embodiment of a spreadsheet view for data entry. Using the display depicted in FIG. 6, a user can create and edit information for one or more fields. The data manager may include spreadsheets for inputting information with respect to Nitrogen, Planting, Practices, and Soil as depicted in FIG. 6. To edit a particular entry, a user computer may select the particular entry in the spreadsheet and update the values. For example, FIG. 6 depicts an in-progress update to a target yield value for the second field. Additionally, a user computer may select one or more fields in order to apply one or more programs. In response to receiving a selection of a program for a particular field, the data manager may automatically complete the entries for the particular field based on the selected program. As with the timeline view, the data manager may update the entries for each field associated with a particular program in response to receiving an update to the program. Additionally, the data manager may remove the correspondence of the selected program to the field in response to receiving an edit to one of the entries for the field.

In an embodiment, model and field data are stored in model and field data repository 160. Model data comprises data models created for one or more fields. For example, a crop model may include a digitally constructed model of the development of a crop on the one or more fields. "Model," in this context, refers to an electronic digitally stored set of executable instructions and data values, associated with one another, which are capable of receiving and responding to a programmatic or other digital call, invocation, or request for resolution based upon specified input values, to yield one or more stored output values that can serve as the basis of computer-implemented recommendations, output data displays, or machine control, among other things. Persons of skill in the field find it convenient to express models using mathematical equations, but that form of expression does not confine the models disclosed herein to abstract concepts; instead, each model herein has a practical application in a computer in the form of stored executable instructions and data that implement the model using the computer. The model data may include a model of past events on the one or more fields, a model of the current status of the one or more fields, and/or a model of predicted events on the one or more fields. Model and field data may be stored in data structures in memory, rows in a database table, in flat files or spreadsheets, or other forms of stored digital data.

Figure 4:
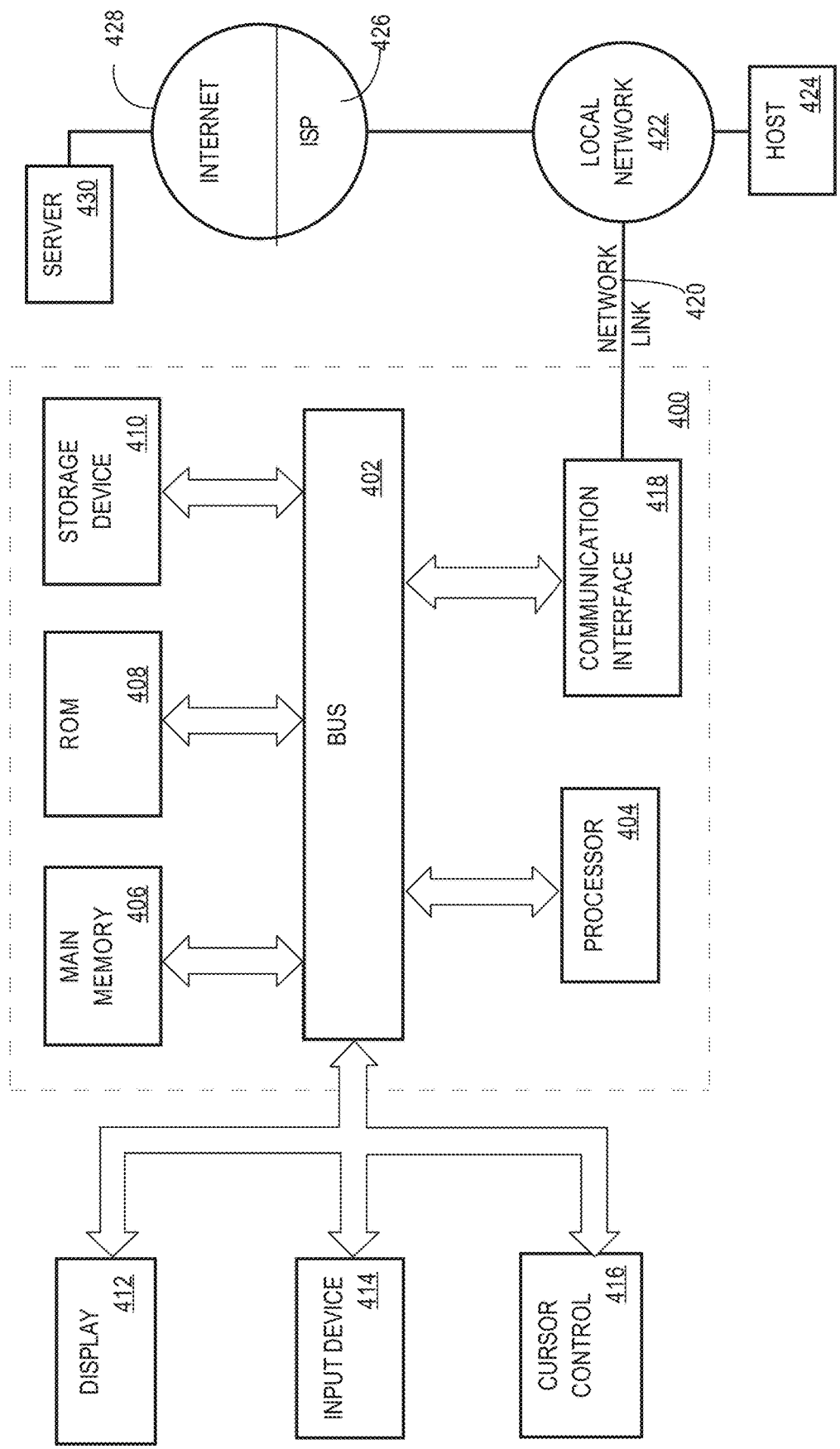
FIG. 4 is a block diagram that illustrates a computer system 400 upon which an embodiment of the invention may be implemented.

Hardware/virtualization layer 150 comprises one or more central processing units (CPUs), memory controllers, and other devices, components, or elements of a computer system such as volatile or non-volatile memory, non-volatile storage such as disk, and I/O devices or interfaces as illustrated and described, for example, in connection with FIG. 4. The layer 150 also may comprise programmed instructions that are configured to support virtualization, containerization, or other technologies.

For purposes of illustrating a clear example, FIG. 1 shows a limited number of instances of certain functional elements. However, in other embodiments, there may be any number of such elements. For example, embodiments may use thousands or millions of different mobile computing devices 104 associated with different users. Further, the system 130 and/or external data server computer 108 may be implemented using two or more processors, cores, clusters, or instances of physical machines or virtual machines, configured in a discrete location or co-located with other elements in a datacenter, shared computing facility or cloud computing facility.

2.2. Application Program Overview

In an embodiment, the implementation of the functions described herein using one or more computer programs or other software elements that are loaded into and executed using one or more general-purpose computers will cause the general-purpose computers to be configured as a particular machine or as a computer that is specially adapted to perform the functions described herein. Further, each of the flow diagrams that are described further herein may serve, alone or in combination with the descriptions of processes and functions in prose herein, as algorithms, plans or directions that may be used to program a computer or logic to implement the functions that are described. In other words, all the prose text herein, and all the drawing figures, together are intended to provide disclosure of algorithms, plans or directions that are sufficient to permit a skilled person to program a computer to perform the functions that are described herein, in combination with the skill and knowledge of such a person given the level of skill that is appropriate for inventions and disclosures of this type.

In an embodiment, user 102 interacts with agricultural intelligence computer system 130 using field manager computing device 104 configured with an operating system and one or more application programs or apps; the field manager computing device 104 also may interoperate with the agricultural intelligence computer system independently and automatically under program control or logical control and direct user interaction is not always required. Field manager computing device 104 broadly represents one or more of smartphones, PDA, tablet computing device, laptop computer, desktop computer, workstation, or any other computing device capable of transmitting and receiving information and performing the functions described herein. Field manager computing device 104 may communicate via a network using a mobile application stored on field manager computing device 104, and in some embodiments, the device may be coupled using a cable 113 or connector to the sensor 112 and/or controller 114. A particular user 102 may own, operate or possess and use, in connection with system 130, more than one field manager computing device 104 at a time.

The mobile application may provide client-side functionality, via the network to one or more mobile computing devices. In an example embodiment, field manager computing device 104 may access the mobile application via a web browser or a local client application or app. Field manager computing device 104 may transmit data to, and receive data from, one or more front-end servers, using web-based protocols or formats such as HTTP, XML and/or JSON, or app-specific protocols. In an example embodiment, the data may take the form of requests and user information input, such as field data, into the mobile computing device. In some embodiments, the mobile application interacts with location tracking hardware and software on field manager computing device 104 which determines the location of field manager computing device 104 using standard tracking techniques such as multilateration of radio signals, the global positioning system (GPS), Wi-Fi positioning systems, or other methods of mobile positioning. In some cases, location data or other data associated with the device 104, user 102, and/or user account(s) may be obtained by queries to an operating system of the device or by requesting an app on the device to obtain data from the operating system.

In an embodiment, field manager computing device 104 sends field data 106 to agricultural intelligence computer system 130 comprising or including, but not limited to, data values representing one or more of: a geographical location of the one or more fields, tillage information for the one or more fields, crops planted in the one or more fields, and soil data extracted from the one or more fields. Field manager computing device 104 may send field data 106 in response to user input from user 102 specifying the data values for the one or more fields. Additionally, field manager computing device 104 may automatically send field data 106 when one or more of the data values becomes available to field manager computing device 104. For example, field manager computing device 104 may be communicatively coupled to remote sensor 112 and/or application controller 114. In response to receiving data indicating that application controller 114 released water onto the one or more fields, field manager computing device 104 may send field data 106 to agricultural intelligence computer system 130 indicating that water was released on the one or more fields. Field data 106 identified in this disclosure may be input and communicated using electronic digital data that is communicated between computing devices using parameterized URLs over HTTP, or another suitable communication or messaging protocol.

A commercial example of the mobile application is CLIMATE FIELDVIEW, commercially available from The Climate Corporation, San Francisco, Calif. The CLIMATE FIELDVIEW application, or other applications, may be modified, extended, or adapted to include features, functions, and programming that have not been disclosed earlier than the filing date of this disclosure. In one embodiment, the mobile application comprises an integrated software platform that allows a grower to make fact-based decisions for their operation because it combines historical data about the grower's fields with any other data that the grower wishes to compare. The combinations and comparisons may be performed in real time and are based upon scientific models that provide potential scenarios to permit the grower to make better, more informed decisions.

FIG. 2 illustrates two views of an example logical organization of sets of instructions in main memory when an example mobile application is loaded for execution. In FIG. 2, each named element represents a region of one or more pages of RAM or other main memory, or one or more blocks of disk storage or other non-volatile storage, and the programmed instructions within those regions. In one embodiment, in view (a), a mobile computer application 200 comprises account, fields, data ingestion, sharing instructions 202, overview and alert instructions 204, digital map book instructions 206, seeds and planting instructions 208, nitrogen instructions 210, weather instructions 212, field health instructions 214, and performance instructions 216.

In one embodiment, a mobile computer application 200 comprises account, fields, data ingestion, sharing instructions 202 which are programmed to receive, translate, and ingest field data from third party systems via manual upload or APIs. Data types may include field boundaries, yield maps, as-planted maps, soil test results, as-applied maps, and/or management zones, among others. Data formats may include shape files, native data formats of third parties, and/or farm management information system (FMIS) exports, among others. Receiving data may occur via manual upload, e-mail with attachment, external APIs that push data to the mobile application, or instructions that call APIs of external systems to pull data into the mobile application. In one embodiment, mobile computer application 200 comprises a data inbox. In response to receiving a selection of the data inbox, the mobile computer application 200 may display a graphical user interface for manually uploading data files and importing uploaded files to a data manager.

In one embodiment, digital map book instructions 206 comprise field map data layers stored in device memory and are programmed with data visualization tools and geospatial field notes. This provides growers with convenient information close at hand for reference, logging and visual insights into field performance. In one embodiment, overview and alert instructions 204 are programmed to provide an operation-wide view of what is important to the grower, and timely recommendations to take action or focus on particular issues. This permits the grower to focus time on what needs attention, to save time and preserve yield throughout the season. In one embodiment, seeds and planting instructions 208 are programmed to provide tools for seed selection, hybrid placement, and script creation, including variable rate (VR) script creation, based upon scientific models and empirical data. This enables growers to maximize yield or return on investment through optimized seed purchase, placement and population.

In one embodiment, script generation instructions 205 are programmed to provide an interface for generating scripts, including variable rate (VR) fertility scripts. The interface enables growers to create scripts for field implements, such as nutrient applications, planting, and irrigation. For example, a planting script interface may comprise tools for identifying a type of seed for planting. Upon receiving a selection of the seed type, mobile computer application 200 may display one or more fields broken into management zones, such as the field map data layers created as part of digital map book instructions 206. In one embodiment, the management zones comprise soil zones along with a panel identifying each soil zone and a soil name, texture, drainage for each zone, or other field data. Mobile computer application 200 may also display tools for editing or creating such, such as graphical tools for drawing management zones, such as soil zones, over a map of one or more fields. Planting procedures may be applied to all management zones or different planting procedures may be applied to different subsets of management zones. When a script is created, mobile computer application 200 may make the script available for download in a format readable by an application controller, such as an archived or compressed format. Additionally, and/or alternatively, a script may be sent directly to cab computer 115 from mobile computer application 200 and/or uploaded to one or more data servers and stored for further use. In one embodiment, nitrogen instructions 210 are programmed to provide tools to inform nitrogen decisions by visualizing the availability of nitrogen to crops. This enables growers to maximize yield or return on investment through optimized nitrogen application during the season. Example programmed functions include displaying images such as SSURGO images to enable drawing of application zones and/or images generated from subfield soil data, such as data obtained from sensors, at a high spatial resolution (as fine as 10 meters or smaller because of their proximity to the soil); upload of existing grower-defined zones; providing an application graph and/or a map to enable tuning application(s) of nitrogen across multiple zones; output of scripts to drive machinery; tools for mass data entry and adjustment; and/or maps for data visualization, among others. "Mass data entry," in this context, may mean entering data once and then applying the same data to multiple fields that have been defined in the system; example data may include nitrogen application data that is the same for many fields of the same grower, but such mass data entry applies to the entry of any type of field data into the mobile computer application 200. For example, nitrogen instructions 210 may be programmed to accept definitions of nitrogen planting and practices programs and to accept user input specifying to apply those programs across multiple fields. "Nitrogen planting programs," in this context, refers to a stored, named set of data that associates: a name, color code or other identifier, one or more dates of application, types of material or product for each of the dates and amounts, method of application or incorporation such as injected or knifed in, and/or amounts or rates of application for each of the dates, crop or hybrid that is the subject of the application, among others. "Nitrogen practices programs," in this context, refers to a stored, named set of data that associates: a practices name; a previous crop; a tillage system; a date of primarily tillage; one or more previous tillage systems that were used; one or more indicators of application type, such as manure, that were used. Nitrogen instructions 210 also may be programmed to generate and cause displaying a nitrogen graph, which indicates projections of plant use of the specified nitrogen and whether a surplus or shortfall is predicted; in some embodiments, different color indicators may signal a magnitude of surplus or magnitude of shortfall. In one embodiment, a nitrogen graph comprises a graphical display in a computer display device comprising a plurality of rows, each row associated with and identifying a field; data specifying what crop is planted in the field, the field size, the field location, and a graphic representation of the field perimeter; in each row, a timeline by month with graphic indicators specifying each nitrogen application and amount at points correlated to month names; and numeric and/or colored indicators of surplus or shortfall, in which color indicates magnitude.

In one embodiment, the nitrogen graph may include one or more user input features, such as dials or slider bars, to dynamically change the nitrogen planting and practices programs so that a user may optimize his nitrogen graph. The user may then use his optimized nitrogen graph and the related nitrogen planting and practices programs to implement one or more scripts, including variable rate (VR) fertility scripts. Nitrogen instructions 210 also may be programmed to generate and cause displaying a nitrogen map, which indicates projections of plant use of the specified nitrogen and whether a surplus or shortfall is predicted; in some embodiments, different color indicators may signal a magnitude of surplus or magnitude of shortfall. The nitrogen map may display projections of plant use of the specified nitrogen and whether a surplus or shortfall is predicted for different times in the past and the future (such as daily, weekly, monthly or yearly) using numeric and/or colored indicators of surplus or shortfall, in which color indicates magnitude. In one embodiment, the nitrogen map may include one or more user input features, such as dials or slider bars, to dynamically change the nitrogen planting and practices programs so that a user may optimize his nitrogen map, such as to obtain a preferred amount of surplus to shortfall. The user may then use his optimized nitrogen map and the related nitrogen planting and practices programs to implement one or more scripts, including variable rate (VR) fertility scripts. In other embodiments, similar instructions to the nitrogen instructions 210 could be used for application of other nutrients (such as phosphorus and potassium) application of pesticide, and irrigation programs.

In one embodiment, weather instructions 212 are programmed to provide field-specific recent weather data and forecasted weather information. This enables growers to save time and have an efficient integrated display with respect to daily operational decisions.

In one embodiment, field health instructions 214 are programmed to provide timely remote sensing images highlighting in-season crop variation and potential concerns. Example programmed functions include cloud checking, to identify possible clouds or cloud shadows; determining nitrogen indices based on field images; graphical visualization of scouting layers, including, for example, those related to field health, and viewing and/or sharing of scouting notes; and/or downloading satellite images from multiple sources and prioritizing the images for the grower, among others.

In one embodiment, performance instructions 216 are programmed to provide reports, analysis, and insight tools using on-farm data for evaluation, insights and decisions. This enables the grower to seek improved outcomes for the next year through fact-based conclusions about why return on investment was at prior levels, and insight into yield-limiting factors. The performance instructions 216 may be programmed to communicate via the network(s) 109 to back-end analytics programs executed at agricultural intelligence computer system 130 and/or external data server computer 108 and configured to analyze metrics such as yield, hybrid, population, SSURGO, soil tests, or elevation, among others. Programmed reports and analysis may include yield variability analysis, benchmarking of yield and other metrics against other growers based on anonymized data collected from many growers, or data for seeds and planting, among others.

Applications having instructions configured in this way may be implemented for different computing device platforms while retaining the same general user interface appearance. For example, the mobile application may be programmed for execution on tablets, smartphones, or server computers that are accessed using browsers at client computers. Further, the mobile application as configured for tablet computers or smartphones may provide a full app experience or a cab app experience that is suitable for the display and processing capabilities of cab computer 115. For example, referring now to view (b) of FIG. 2, in one embodiment a cab computer application 220 may comprise maps-cab instructions 222, remote view instructions 224, data collect and transfer instructions 226, machine alerts instructions 228, script transfer instructions 230, and scouting-cab instructions 232. The code base for the instructions of view (b) may be the same as for view (a) and executables implementing the code may be programmed to detect the type of platform on which they are executing and to expose, through a graphical user interface, only those functions that are appropriate to a cab platform or full platform. This approach enables the system to recognize the distinctly different user experience that is appropriate for an in-cab environment and the different technology environment of the cab. The maps-cab instructions 222 may be programmed to provide map views of fields, farms or regions that are useful in directing machine operation. The remote view instructions 224 may be programmed to turn on, manage, and provide views of machine activity in real-time or near real-time to other computing devices connected to the system 130 via wireless networks, wired connectors or adapters, and the like. The data collect and transfer instructions 226 may be programmed to turn on, manage, and provide transfer of data collected at machine sensors and controllers to the system 130 via wireless networks, wired connectors or adapters, and the like. The machine alerts instructions 228 may be programmed to detect issues with operations of the machine or tools that are associated with the cab and generate operator alerts. The script transfer instructions 230 may be configured to transfer in scripts of instructions that are configured to direct machine operations or the collection of data. The scouting-cab instructions 232 may be programmed to display location-based alerts and information received from the system 130 based on the location of the agricultural apparatus 111 or sensors 112 in the field and ingest, manage, and provide transfer of location-based scouting observations to the system 130 based on the location of the agricultural apparatus 111 or sensors 112 in the field.

2.3. Data Ingest to the Computer System

In an embodiment, external data server computer 108 stores external data 110, including soil data representing soil composition for the one or more fields and weather data representing temperature and precipitation on the one or more fields. The weather data may include past and present weather data as well as forecasts for future weather data. In an embodiment, external data server computer 108 comprises a plurality of servers hosted by different entities. For example, a first server may contain soil composition data while a second server may include weather data. Additionally, soil composition data may be stored in multiple servers. For example, one server may store data representing percentage of sand, silt, and clay in the soil while a second server may store data representing percentage of organic matter (OM) in the soil.

In an embodiment, remote sensor 112 comprises one or more sensors that are programmed or configured to produce one or more observations. Remote sensor 112 may be aerial sensors, such as satellites, vehicle sensors, planting equipment sensors, tillage sensors, fertilizer or insecticide application sensors, harvester sensors, and any other implement capable of receiving data from the one or more fields. In an embodiment, application controller 114 is programmed or configured to receive instructions from agricultural intelligence computer system 130. Application controller 114 may also be programmed or configured to control an operating parameter of an agricultural vehicle or implement. For example, an application controller may be programmed or configured to control an operating parameter of a vehicle, such as a tractor, planting equipment, tillage equipment, fertilizer or insecticide equipment, harvester equipment, or other farm implements such as a water valve. Other embodiments may use any combination of sensors and controllers, of which the following are merely selected examples.

The system 130 may obtain or ingest data under user 102 control, on a mass basis from a large number of growers who have contributed data to a shared database system. This form of obtaining data may be termed "manual data ingest" as one or more user-controlled computer operations are requested or triggered to obtain data for use by the system 130. As an example, the CLIMATE FIELDVIEW application, commercially available from The Climate Corporation, San Francisco, Calif., may be operated to export data to system 130 for storing in the repository 160.

For example, seed monitor systems can both control planter apparatus components and obtain planting data, including signals from seed sensors via a signal harness that comprises a CAN backbone and point-to-point connections for registration and/or diagnostics. Seed monitor systems can be programmed or configured to display seed spacing, population and other information to the user via the cab computer 115 or other devices within the system 130. Examples are disclosed in U.S. Pat. No. 8,738,243 and US Pat. Pub. 20150094916, and the present disclosure assumes knowledge of those other patent disclosures.

Likewise, yield monitor systems may contain yield sensors for harvester apparatus that send yield measurement data to the cab computer 115 or other devices within the system 130. Yield monitor systems may utilize one or more remote sensors 112 to obtain grain moisture measurements in a combine or other harvester and transmit these measurements to the user via the cab computer 115 or other devices within the system 130.

In an embodiment, examples of sensors 112 that may be used with any moving vehicle or apparatus of the type described elsewhere herein include kinematic sensors and position sensors. Kinematic sensors may comprise any of speed sensors such as radar or wheel speed sensors, accelerometers, or gyros. Position sensors may comprise GPS receivers or transceivers, or Wi-Fi-based position or mapping apps that are programmed to determine location based upon nearby Wi-Fi hotspots, among others.

In an embodiment, examples of sensors 112 that may be used with tractors or other moving vehicles include engine speed sensors, fuel consumption sensors, area counters or distance counters that interact with GPS or radar signals, PTO (power take-off) speed sensors, tractor hydraulics sensors configured to detect hydraulics parameters such as pressure or flow, and/or and hydraulic pump speed, wheel speed sensors or wheel slippage sensors. In an embodiment, examples of controllers 114 that may be used with tractors include hydraulic directional controllers, pressure controllers, and/or flow controllers; hydraulic pump speed controllers; speed controllers or governors; hitch position controllers; or wheel position controllers that provide automatic steering.

In an embodiment, examples of sensors 112 that may be used with seed planting equipment such as planters, drills, or air seeders include seed sensors, which may be optical, electromagnetic, or impact sensors; downforce sensors such as load pins, load cells, or pressure sensors; soil property sensors such as reflectivity sensors, moisture sensors, electrical conductivity sensors, optical residue sensors, or temperature sensors; component operating criteria sensors such as planting depth sensors, downforce cylinder pressure sensors, seed disc speed sensors, seed drive motor encoders, seed conveyor system speed sensors, or vacuum level sensors; or pesticide application sensors such as optical or other electromagnetic sensors, or impact sensors. In an embodiment, examples of controllers 114 that may be used with such seed planting equipment include: toolbar fold controllers, such as controllers for valves associated with hydraulic cylinders; downforce controllers, such as controllers for valves associated with pneumatic cylinders, airbags, or hydraulic cylinders, and programmed for applying downforce to individual row units or an entire planter frame; planting depth controllers, such as linear actuators; metering controllers, such as electric seed meter drive motors, hydraulic seed meter drive motors, or swath control clutches; hybrid selection controllers, such as seed meter drive motors, or other actuators programmed for selectively allowing or preventing seed or an air-seed mixture from delivering seed to or from seed meters or central bulk hoppers; metering controllers, such as electric seed meter drive motors, or hydraulic seed meter drive motors; seed conveyor system controllers, such as controllers for a belt seed delivery conveyor motor; marker controllers, such as a controller for a pneumatic or hydraulic actuator; or pesticide application rate controllers, such as metering drive controllers, orifice size or position controllers.

In an embodiment, examples of sensors 112 that may be used with tillage equipment include position sensors for tools such as shanks or discs; tool position sensors for such tools that are configured to detect depth, gang angle, or lateral spacing; downforce sensors; or draft force sensors. In an embodiment, examples of controllers 114 that may be used with tillage equipment include downforce controllers or tool position controllers, such as controllers configured to control tool depth, gang angle, or lateral spacing.

In an embodiment, examples of sensors 112 that may be used in relation to apparatus for applying fertilizer, insecticide, fungicide and the like, such as on-planter starter fertilizer systems, subsoil fertilizer applicators, or fertilizer sprayers, include: fluid system criteria sensors, such as flow sensors or pressure sensors; sensors indicating which spray head valves or fluid line valves are open; sensors associated with tanks, such as fill level sensors; sectional or system-wide supply line sensors, or row-specific supply line sensors; or kinematic sensors such as accelerometers disposed on sprayer booms. In an embodiment, examples of controllers 114 that may be used with such apparatus include pump speed controllers; valve controllers that are programmed to control pressure, flow, direction, pulse width modulation (PWM) and the like; or position actuators, such as for boom height, subsoiler depth, or boom position.

In an embodiment, examples of sensors 112 that may be used with harvesters include yield monitors, such as impact plate strain gauges or position sensors, capacitive flow sensors, load sensors, weight sensors, or torque sensors associated with elevators or augers, or optical or other electromagnetic grain height sensors; grain moisture sensors, such as capacitive sensors; grain loss sensors, including impact, optical, or capacitive sensors; header operating criteria sensors such as header height, header type, deck plate gap, feeder speed, and reel speed sensors; separator operating criteria sensors, such as concave clearance, rotor speed, shoe clearance, or chaffer clearance sensors; auger sensors for position, operation, or speed; or engine speed sensors. In an embodiment, examples of controllers 114 that may be used with harvesters include header operating criteria controllers for elements such as header height, header type, deck plate gap, feeder speed, or reel speed; separator operating criteria controllers for features such as concave clearance, rotor speed, shoe clearance, or chaffer clearance; or controllers for auger position, operation, or speed.

In an embodiment, examples of sensors 112 that may be used with grain carts include weight sensors, or sensors for auger position, operation, or speed. In an embodiment, examples of controllers 114 that may be used with grain carts include controllers for auger position, operation, or speed.

In an embodiment, examples of sensors 112 and controllers 114 may be installed in unmanned aerial vehicle (UAV) apparatus or "drones." Such sensors may include cameras with detectors effective for any range of the electromagnetic spectrum including visible light, infrared, ultraviolet, near-infrared (NIR), and the like; accelerometers; altimeters; temperature sensors; humidity sensors; pitot tube sensors or other airspeed or wind velocity sensors; battery life sensors; or radar emitters and reflected radar energy detection apparatus. Such controllers may include guidance or motor control apparatus, control surface controllers, camera controllers, or controllers programmed to turn on, operate, obtain data from, manage and configure any of the foregoing sensors. Examples are disclosed in U.S. patent application Ser. No. 14/831,165 and the present disclosure assumes knowledge of that other patent disclosure.

In an embodiment, sensors 112 and controllers 114 may be affixed to soil sampling and measurement apparatus that is configured or programmed to sample soil and perform soil chemistry tests, soil moisture tests, and other tests pertaining to soil. For example, the apparatus disclosed in U.S. Pat. Nos. 8,767,194 and 8,712,148 may be used, and the present disclosure assumes knowledge of those patent disclosures.

In another embodiment, sensors 112 and controllers 114 may comprise weather devices for monitoring weather conditions of fields. For example, the apparatus disclosed in International Pat. Application No. PCT/US2016/029609 may be used, and the present disclosure assumes knowledge of those patent disclosures.

2.4 Process Overview-Agronomic Model Training

In an embodiment, the agricultural intelligence computer system 130 is programmed or configured to create an agronomic model. In this context, an agronomic model is a data structure in memory of the agricultural intelligence computer system 130 that comprises field data 106, such as identification data and harvest data for one or more fields. The agronomic model may also comprise calculated agronomic properties which describe either conditions which may affect the growth of one or more crops on a field, or properties of the one or more crops, or both. Additionally, an agronomic model may comprise recommendations based on agronomic factors such as crop recommendations, irrigation recommendations, planting recommendations, and harvesting recommendations. The agronomic factors may also be used to estimate one or more crop related results, such as agronomic yield. The agronomic yield of a crop is an estimate of quantity of the crop that is produced, or in some examples the revenue or profit obtained from the produced crop.

In an embodiment, the agricultural intelligence computer system 130 may use a preconfigured agronomic model to calculate agronomic properties related to currently received location and crop information for one or more fields. The preconfigured agronomic model is based upon previously processed field data, including, but not limited to, identification data, harvest data, fertilizer data, and weather data. The preconfigured agronomic model may have been cross validated to ensure accuracy of the model. Cross validation may include comparison to ground truthing that compares predicted results with actual results on a field, such as a comparison of precipitation estimate with a rain gauge or sensor providing weather data at the same or nearby location or an estimate of nitrogen content with a soil sample measurement.

Figure 3:
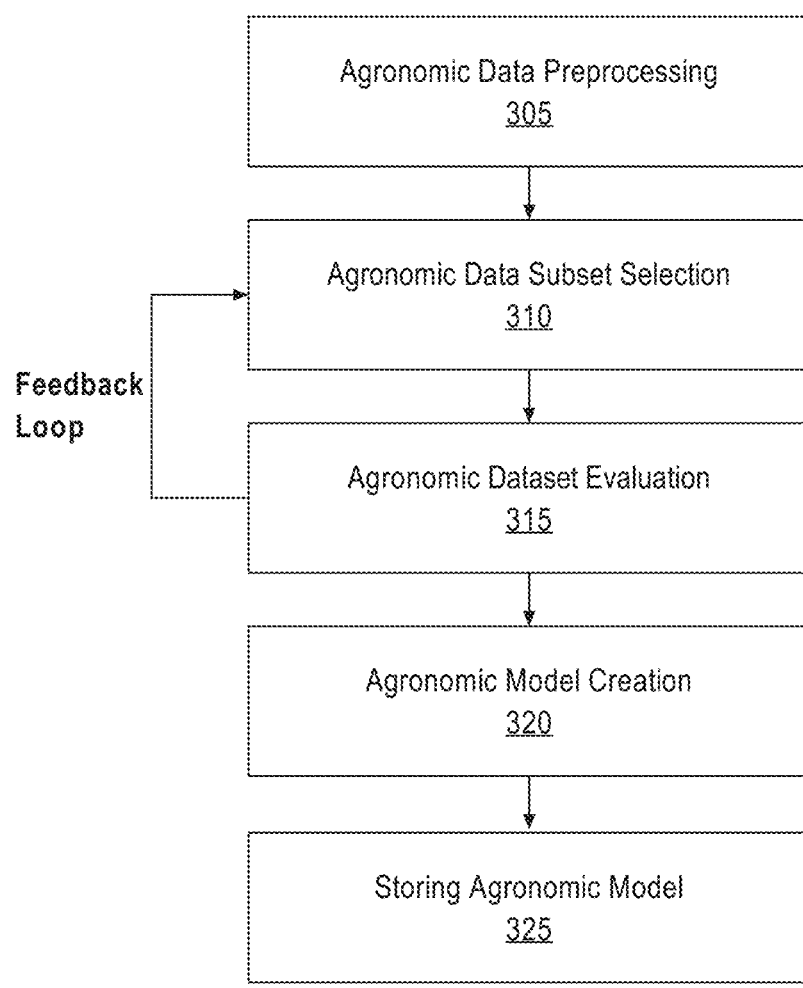
FIG. 3 illustrates a programmed process by which the agricultural intelligence computer system generates one or more preconfigured agronomic models using agronomic data provided by one or more data sources.

FIG. 3 illustrates a programmed process by which the agricultural intelligence computer system generates one or more preconfigured agronomic models using field data provided by one or more data sources. FIG. 3 may serve as an algorithm or instructions for programming the functional elements of the agricultural intelligence computer system 130 to perform the operations that are now described.

At block 305, the agricultural intelligence computer system 130 is configured or programmed to implement agronomic data preprocessing of field data received from one or more data sources. The field data received from one or more data sources may be preprocessed for the purpose of removing noise and distorting effects within the agronomic data including measured outliers that would bias received field data values. Embodiments of agronomic data preprocessing may include, but are not limited to, removing data values commonly associated with outlier data values, specific measured data points that are known to unnecessarily skew other data values, data smoothing techniques used to remove or reduce additive or multiplicative effects from noise, and other filtering or data derivation techniques used to provide clear distinctions between positive and negative data inputs.

At block 310, the agricultural intelligence computer system 130 is configured or programmed to perform data subset selection using the preprocessed field data in order to identify datasets useful for initial agronomic model generation. The agricultural intelligence computer system 130 may implement data subset selection techniques including, but not limited to, a genetic algorithm method, an all subset models method, a sequential search method, a stepwise regression method, a particle swarm optimization method, and an ant colony optimization method. For example, a genetic algorithm selection technique uses an adaptive heuristic search algorithm, based on evolutionary principles of natural selection and genetics, to determine and evaluate datasets within the preprocessed agronomic data.

At block 315, the agricultural intelligence computer system 130 is configured or programmed to implement field dataset evaluation. In an embodiment, a specific field dataset is evaluated by creating an agronomic model and using specific quality thresholds for the created agronomic model. Agronomic models may be compared using cross validation techniques including, but not limited to, root mean square error of leave-one-out cross validation (RMSECV), mean absolute error, and mean percentage error. For example, RMSECV can cross validate agronomic models by comparing predicted agronomic property values created by the agronomic model against historical agronomic property values collected and analyzed. In an embodiment, the agronomic dataset evaluation logic is used as a feedback loop where agronomic datasets that do not meet configured quality thresholds are used during future data subset selection steps (block 310).

At block 320, the agricultural intelligence computer system 130 is configured or programmed to implement agronomic model creation based upon the cross validated agronomic datasets. In an embodiment, agronomic model creation may implement multivariate regression techniques to create preconfigured agronomic data models.

At block 325, the agricultural intelligence computer system 130 is configured or programmed to store the preconfigured agronomic data models for future field data evaluation.

2.5 Implementation Example—Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

For example, FIG. 4 is a block diagram that illustrates a computer system 400 upon which an embodiment of the invention may be implemented. Computer system 400 includes a bus 402 or other communication mechanism for communicating information, and a hardware processor 404 coupled with bus 402 for processing information. Hardware processor 404 may be, for example, a general-purpose microprocessor.

Computer system 400 also includes a main memory 406, such as a random-access memory (RAM) or other dynamic storage device, coupled to bus 402 for storing information and instructions to be executed by processor 404. Main memory 406 also may be used for storing temporary variables or other intermediate information during execution of instructions to be executed by processor 404. Such instructions, when stored in non-transitory storage media accessible to processor 404, render computer system 400 into a special-purpose machine that is customized to perform the operations specified in the instructions.

Computer system 400 further includes a read only memory (ROM) 408 or other static storage device coupled to bus 402 for storing static information and instructions for processor 404. A storage device 410, such as a magnetic disk, optical disk, or solid-state drive is provided and coupled to bus 402 for storing information and instructions.

Computer system 400 may be coupled via bus 402 to a display 412, such as a cathode ray tube (CRT), for displaying information to a computer user. An input device 414, including alphanumeric and other keys, is coupled to bus 402 for communicating information and command selections to processor 404. Another type of user input device is cursor control 416, such as a mouse, a trackball, or cursor direction keys for communicating direction information and command selections to processor 404 and for controlling cursor movement on display 412. This input device typically has two degrees of freedom in two axes, a first axis (e.g., x) and a second axis (e.g., y), that allows the device to specify positions in a plane.

Computer system 400 may implement the techniques described herein using customized hard-wired logic, one or more ASICs or FPGAs, firmware and/or program logic which in combination with the computer system causes or programs computer system 400 to be a special-purpose machine. According to one embodiment, the techniques herein are performed by computer system 400 in response to processor 404 executing one or more sequences of one or more instructions contained in main memory 406. Such instructions may be read into main memory 406 from another storage medium, such as storage device 410. Execution of the sequences of instructions contained in main memory 406 causes processor 404 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical disks, magnetic disks, or solid-state drives, such as storage device 410. Volatile media includes dynamic memory, such as main memory 406. Common forms of storage media include, for example, a floppy disk, a flexible disk, hard disk, solid-state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 402. Transmission media can also take the form of acoustic or light waves, such as those generated during radio-wave and infra-red data communications.

Various forms of media may be involved in carrying one or more sequences of one or more instructions to processor 404 for execution. For example, the instructions may initially be carried on a magnetic disk or solid-state drive of a remote computer. The remote computer can load the instructions into its dynamic memory and send the instructions over a telephone line using a modem. A modem local to computer system 400 can receive the data on the telephone line and use an infra-red transmitter to convert the data to an infra-red signal. An infra-red detector can receive the data carried in the infra-red signal and appropriate circuitry can place the data on bus 402. Bus 402 carries the data to main memory 406, from which processor 404 retrieves and executes the instructions. The instructions received by main memory 406 may optionally be stored on storage device 410 either before or after execution by processor 404.

Computer system 400 also includes a communication interface 418 coupled to bus 402. Communication interface 418 provides a two-way data communication coupling to a network link 420 that is connected to a local network 422. For example, communication interface 418 may be an integrated service digital network (ISDN) card, cable modem, satellite modem, or a modem to provide a data communication connection to a corresponding type of telephone line. As another example, communication interface 418 may be a local area network (LAN) card to provide a data communication connection to a compatible LAN. Wireless links may also be implemented. In any such implementation, communication interface 418 sends and receives electrical, electromagnetic or optical signals that carry digital data streams representing various types of information.

Network link 420 typically provides data communication through one or more networks to other data devices. For example, network link 420 may provide a connection through local network 422 to a host computer 424 or to data equipment operated by an Internet Service Provider (ISP) 426. ISP 426 in turn provides data communication services through the worldwide packet data communication network now commonly referred to as the "Internet" 428. Local network 422 and Internet 428 both use electrical, electromagnetic or optical signals that carry digital data streams. The signals through the various networks and the signals on network link 420 and through communication interface 418, which carry the digital data to and from computer system 400, are example forms of transmission media.

Computer system 400 can send messages and receive data, including program code, through the network(s), network link 420 and communication interface 418. In the Internet example, a server 430 might transmit a requested code for an application program through Internet 428, ISP 426, local network 422 and communication interface 418.

The received code may be executed by processor 404 as it is received, and/or stored in storage device 410, or other non-volatile storage for later execution.

3. Identifying Management Zones Based on Historical Yield Data

A management zone usually includes one or more subregions within an agricultural field that have similar limiting factors influencing yields of crops harvested from the subregions. Subregions that belong to the same management zone can usually be managed uniformly.

In an embodiment, management zones are created automatically using specialized processors. An automatic creation of the zones may include several processing steps, some of which are performed either sequentially or in parallel.

Creating management zones may start with receiving yield data representing yields of crops harvested from an agricultural field. The yield data may include historical, sub-field yield maps, or any other types of data representing the yield information.

In an embodiment, received yield data are preprocessed. In some situations, preprocessing is optional; in other situations, preprocessing is mandatory. Preprocessing may be performed to correct various problems with the yield data. This may include identifying and removing outliers, determining whether any yield data for the field is missing, generating substitute values for the missing data, or correcting errors in the received data.

Received yield data may also be normalized. This may include converting the received yield data to data that is within the same data range. Yield data may also be processed by applying smoothing functions to the data. Smoothing of the data may help to eliminate outliers, fill in the missing data records, and correct inaccurate observations.

Data that has been preprocessed, normalized and smoothed may be used to delineate management zones. Delineation may include classifying the field into different productivity regions. Through this process, one or more management zones may be created, and each of the zones may be identified as different from the remaining zones because it produces different yield of crops than other zones.

In an embodiment, a set of management zones is post-processed. Post-processing may include removing undesirably fragmented or small zones, and merging them with other, larger zones.

In an embodiment, a set of first merged management zones is used to automatically control a computer control system of one or more of seeding, irrigation, nitrogen application, and harvesting operations.

In an embodiment, a process of creating management zones is fully automated and is executed fast enough to operate in real time. The process allows creating management zones that are spatially contiguous and have reasonable sizes.

The process may also provide a quality measure to tune various parameters used in the delineation steps. A quality measure may be configured to mathematically model and balance the compactness of yield data within each zone and the separation of yield data between different zones. Using the quality measure allows generating management zones that have not only homogeneous yields within each zone and year, but also have different yield patterns between each other. The differentiation of the yield patterns among different zones allows customizing the cultivation practices for each individual zone.

3.1 Management Zones Creating Pipeline

In the context of precision agriculture, management zones are contiguous subregions of a field with a relatively homogeneous combination of yield limiting factors, such that the optimal rate of a specific crop input or management practice is reasonably uniform within each zone.

One of the objectives for creating the zones is to divide the entire agricultural field into different productivity regions with distinctive spatial-temporal yielding behaviors. Creating, or identifying, such zones may help and guide the crop growers by providing them with recommendations for seeding rate selections based on the monotonic relationship found between observed yields.

In an embodiment, management zones are delineated within an agricultural field using a management zone creating pipeline.

Figure 7:
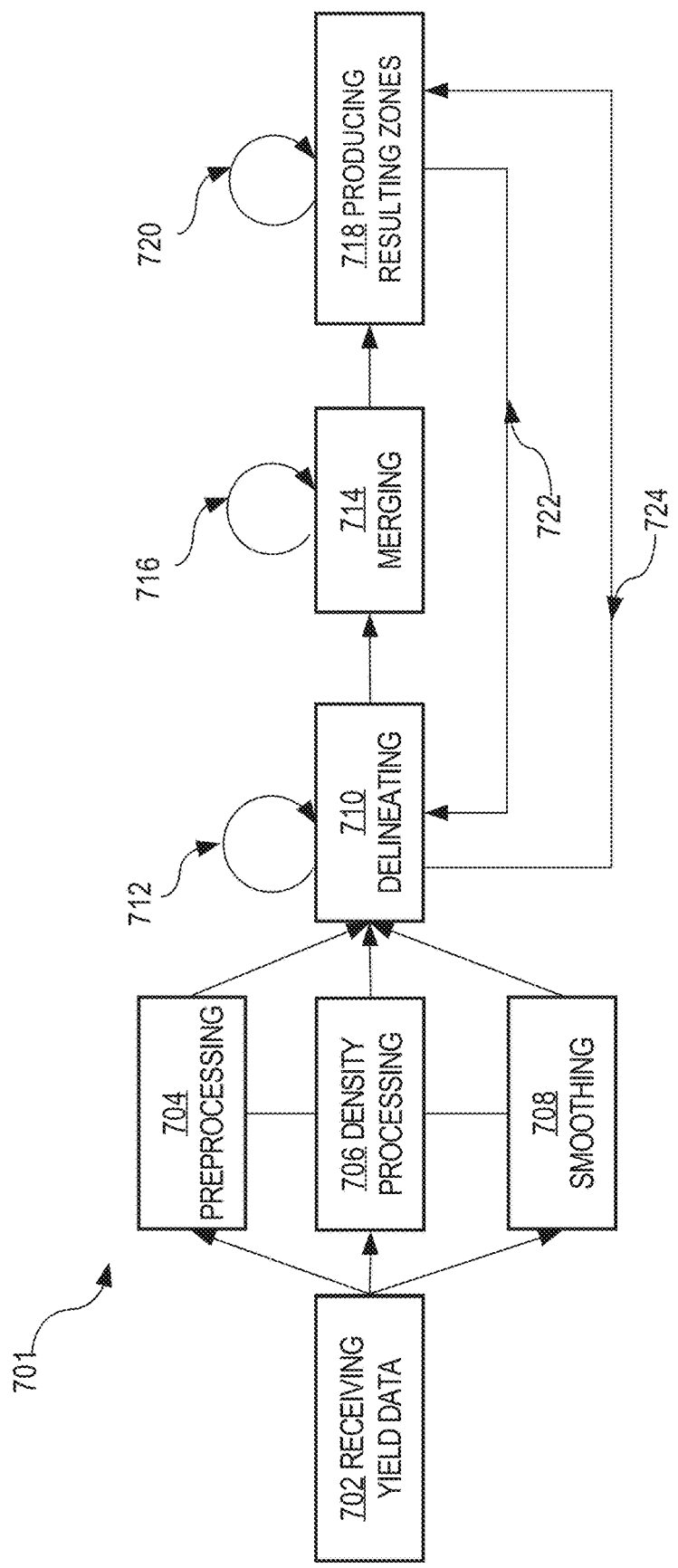
FIG. 7 depicts an example embodiment of a management zone creation pipeline.

FIG. 7 depicts an example embodiment of a management zone creation pipeline. FIG. 7 represents programmed processing steps and may represent an algorithm for use in programming the instructions previously discussed for FIG. 1. Management zone creating pipeline 701 includes processing blocks for actions performed sequentially, in parallel or that are optional as further described in this section.

Block 702 represents program instructions for receiving data. In block 702, yield data are received; for example, system 130 (FIG. 1) receives yield data as part of the field data 106. The yield data may include historical yield maps at the field level or sub field level. The maps represent spatio-temporal yielding patterns for the sub-fields and are used to classify a field into regions with distinctive or different productivity potentials.

Yield data may be received from different sources such as research partners (RP), agencies, organizations, growers and others. Yield data may include information about yield of crops harvested from an agricultural field within one year or multiple years. In an embodiment, yield data may also include metadata such as a field boundary, a field size, and a location of each sub-field within the field.

Blocks 704, 706 and 708 represent program instructions for preprocessing, density processing and data smoothing of the received yield data. Preprocessing at block 704 may be performed, for example, because some of the yield data observations for a field may be collected outside of corresponding field boundaries. The preprocessing may also be recommended when the yield data are provided from a field on which multiple crops were planted in the same season.

Instructions for blocks 704, 706 and 708 may be executed selectively, optionally, sequentially, or in parallel. The manner in which the tasks are selected can vary based on the implementation and the quality of received yield data. For example, some of the received yield data may need preprocessing but not smoothing. Other data may need only density processing. Selecting one or more of blocks 704, 706, 708 may be based on manual or machine inspection of the received yield data as part of block 702.

In block 704, preprocessing may include identifying and removing yield observations that are outside of their corresponding field boundaries. Preprocessing may also include identifying, and removing, the yield observations if multiple crops were planted within the field in the same season. Other examples of yield data preprocessing are described in connection with FIG. 8.

In block 706, yield data are processed based on data density. Data density processing may be performed to normalize the yield data across different crops and fields. In an embodiment, data density processing comprises using an empirical cumulative distribution function (ECDF) transformation, which may be performed on the yield records for each field and year so that the transformed yield data are within a certain range across different crops and fields. For example, the ECDF may be applied to the received yield data to transform the data into transformed yield data in the range of [0, 1]. Once the yield data are transformed, the transformed yield data may be compared across different years and crops, such as corn, soy, or wheat.

In block 708, yield data are processed by smoothing. Data smoothing may include testing whether any yield data records are missing, whether the yield data records need to be further smoothed, or whether certain yield data records need to be removed or interpolated.

In block 710, yield data are used to delineate a set of management zones for an agricultural field. A set of delineated management zones may be represented using stored digital zone data, and created by applying centroid-based approaches, such as a K-means approach, or a fuzzy C-means approach. Details of these approaches are described further herein in connection with FIG. 8. The process executed in block 710 may be repeated, as depicted by arrow 712, one or more times until the quality of the created management zones is satisfactory. The process may be repeated using different criteria, different parameters, or different parameter values.

One criterion that may be used to determine a quality of management zones is compactness. Zones that are generated using a good management zone delineation approach are compact. Generating compact zones involves maximizing the within-zone homogeneity. There should also be a well-defined separation between different zones to ensure that the created zones actually require different management practices. The compactness and separation of the created management zones may be evaluated by a visual assessment by either directly overlapping the delineated zones with the yield maps, or by plotting the distribution of yield values in each zone and year. The compactness and separation may also be evaluated by a quantitative assessment which defines numeric measures to accurately quantify the compactness and separation of yield observations in the delineated zones. Details of determining a quality of the created management zones as represented in zone data are described further herein in connection with FIG. 8.

In block 714, a set of delineated management zones is analyzed to determine whether some of the zones may be merged. For example, a set of delineated management zones may be analyzed to identify small zones and to determine whether the small zones may be merged with neighboring larger zones.

Small zones may be identified automatically by a computer system, or manually by a user of the computer system. For example, the computer system may display information about the set of first management zones to a crop grower in a graphical user interface that is programmed with widgets or controls to allow the grower to remove undesirable fragmented small zones, or to merge the fragmented small zones with larger zones. Merging of zones results in obtaining a set of merged management zones. Details about merging the management zones are described further herein in connection with FIG. 8.

If small zones cannot be identified in a set of delineated management zones, then the set of delineated management zones is provided to block 718, as indicated by 724, and thus bypassing block 714.

The process executed in block 714 may be repeated, as depicted by arrow 716, one or more times until no small zones are identified in the set of management zones. The process may be repeated using different criteria, different parameters, or different parameter values. Details are described further herein in connection with FIG. 8.

In block 718, a set of management zones is post-processed. Post-processing of the management zones may include eliminating the zones that are fragmented or unusable.

The process executed in block 718 may be repeated, as depicted using arrow 720, one or more times until a quality of created management zones is satisfactory. The process may be repeated using different criteria, different parameters, or different parameter values. Details of determining the quality of the created management zones are described further herein in connection with FIG. 8.

In an embodiment, metadata about the created management zones is stored. Furthermore, a test may be performed to determine whether the process of delineating management zones needs to be repeated. If the delineation process is to be repeated, then, as indicated using arrow 722, the delineating of the management zones is repeated in block 710.

3.2 Creating Management Zones

In an embodiment, a management zones creating process is programmed to automatically delineate management zones within an agricultural field based on any type of yield maps.

3.2.1 Yield Data

Figure 8:
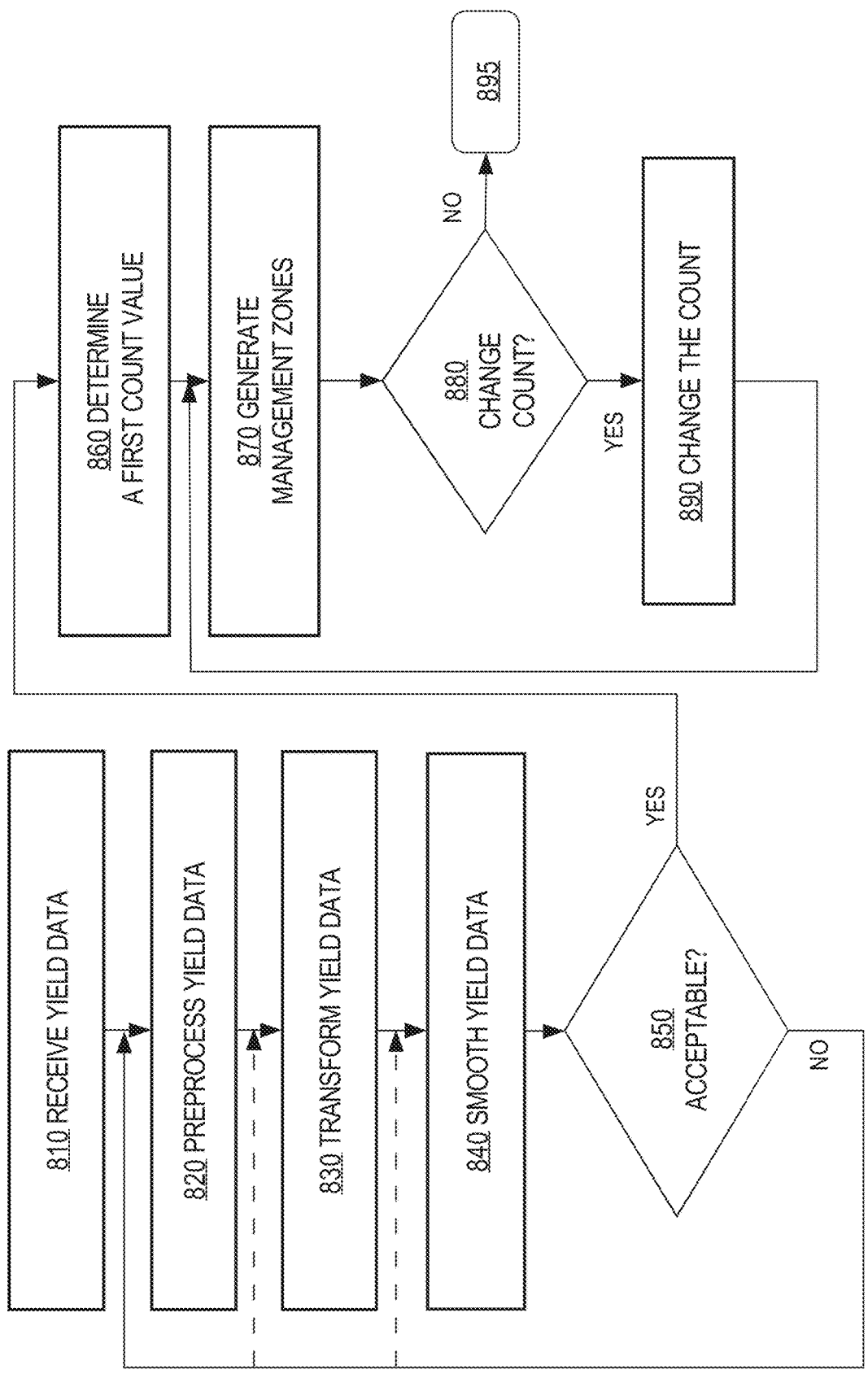
FIG. 8 depicts a method for creating management zones for an agricultural field.

FIG. 8 depicts a method for creating management zones for an agricultural field. In step 810, yield data are received. As described for FIG. 7, the yield data represents yields of crops that have been harvested from an agricultural field. Yield data may include historical, sub-field yield maps that represent spatio-temporal yielding patterns for the sub-fields. Yield data may be provided from different sources, such as research partners, agricultural agencies or organizations, growers, governmental agencies, and others. Yield data may include information about yields of crops harvested from an agricultural field within one year or within several years. In an embodiment, yield data may also include additional information such as a field boundary, a field size, and a location of each sub-field within the field.

3.2.2 Preprocessing of Received Data

In step 820, the received yield data are preprocessed. Preprocessing of the yield data may be performed to reduce noise observations from the yield observations, impute missing yield values to standardize the zone delineation step, and so forth. In an embodiment, received yield data are preprocessed to correct certain issues with the data. The preprocessing may include various types of data cleaning and filtering.

In an embodiment, preprocessing of yield data includes removing outliers from the yield data. Yield data may include sub-field yield observations that consist of various contaminations caused by unavoidable errors introduced by the way the crops are harvested, or by the way the yield data are collected or recorded. Removing of such errors or outliers effectively results in decontaminating the yield data.

In an embodiment, yield data received for an agricultural field is analyzed to identify yield maps that correspond to multiple crops planted in the same season and in the same field. If such maps are found, then such maps may be neglected from further processing.

In an embodiment, received yield data are analyzed to identify any yield records that are outside of the field boundaries. If such yield records are found, then such records may be removed.

In an embodiment, received yield data are analyzed to identify yield records that contain absolute zeros. Those records may be considered as missing values, and thus may be ignored in further processing. Missing records may be due to the nature of their cleaning procedures. However, in some cases, those records may be subjected to a further analysis and validation, through which it may be determined that the records are valid.

In an embodiment, received yield data are analyzed to identify any yield maps that has more than 70% missing data records. Such yield maps may be removed from the yield data.

In an embodiment, received yield data are analyzed to determine whether less than two years of yield maps for a field are provided. If less than two years of yield maps for a field are provided, then the yield maps are not included in the zone delineation.

In embodiment, additional data preprocessing and filtering are performed on yield data. An example is adjusting to account for grain moisture. Grain moisture adjustment allows correcting the yield data records for some fields and years that were harvested at a moisture level that is other than a standard moisture level such as 15.5% moisture.

The additional processing may also be directed to correcting yield productivity data caused when the experimental yield data are provided. The additional processing may include correcting of yield data if the data was pre-smoothed by the data provider using undesired algorithms or parameters. This type of additional processing is recommended to reduce the effect of improperly smoothed yield data on the results of the management zones creation.

In an embodiment, yield records in the received yield data are transformed from Latitude-Longitude coordinates to Universal Transverse Mercator (UTM) coordinates, and mapped onto a grid of for example, 10 m×10 m grid defined for the field. The mapping allows standardization of locations of the yield records within the field, which assists management zone creation.

3.2.3 Imputing Missing Yield Values

In an embodiment, either raw or processed yield data for a field is plotted on a virtual geometric digital grid for the field. If no yield data record is plotted on a particular grid, then yield data records from neighboring grids is retrieved and used to determine a particular yield data record for the particular grid.

A particular yield data record for a particular grid may be determined using programmed instructions that are configured to determine neighboring yield data records from neighboring grids, determine weights for each of the neighboring yield data records, compute a weighted sum of the neighboring yield data records, and use the computed weighted sum as the particular yield data. The weights may be inversely proportional to a distance between the particular grid, or a center of the particular grid, and respective neighboring grids, or their centers. If a grid size is for example 10 m, then a maximum distance may be set to for example, 20 m, and so forth. Using this approach, the dispersed missing grid yield data may be interpolated using yield data records from the neighboring grids.

In some situations, yield data for an agricultural field may be incomplete or inaccurate. For example, some yield data may include no valid yield data records for some sub-fields. This may be due to some systematic collection errors or improper data cleaning performed by providers of the yield data. Furthermore, there may be inconsistency in the yield data for the same field, but for different years. For example, when viewing multiple years of yield maps for the same field, the maps for some years may miss some values for a particular sub-field, while other maps for other years may have valid values for the particular sub-field.

Some yield data may be missing data records for certain locations in an agricultural field. This may be caused by for example, an irregular location of a field. In some situations, yield data may contain no yield data records for not just individual locations, but also for a group of locations. This may be caused by problems with the data collection equipment, data corruption, and the like. In these situations, interpolating the missing data may be difficult. However, in other cases, the missing data may be obtained by using data interpolation approaches.

In an embodiment, missing yield data records are determined using a model-based approach. This approach integrates spatiotemporal modeling of the yield maps with subsequent zone delineation algorithms.

In an embodiment, missing yield data records are determined using imputation to supply missing values and ensure a delineation algorithm is provided a complete set of yield data. One of the benefits of this approach is its simplicity and robustness when applied to diverse field conditions. In this approach, it is assumed that missing yield observations have not been yet spatially imputed because of their long distances to other observed locations, or grids, identified in the same yield map.

In an embodiment, imputation is performed on a plurality of yield data observations. Let $Y_{i,t}$ be the yield data observation at a location i and a year t. To impute a missing $Y_{i,t}$, an average of $Y_{i,t'}$ is computed for those years t' in which yield data observations are available. This is expressed using the following equation:

$$\hat{Y}_{i,t} = \frac{\Sigma_{t' \in A_i} Y_{i,t'} \mathbb{1}(t' \in A_i)}{\Sigma_{t' \in A_i} \mathbb{1}(t' \in A_i)} \quad (1)$$

where $A_i$ is the set of years with observed yield values at location i, and $1(\cdot)$ is an indicator function which equals to one if the condition is $(\cdot)$ is true and equals to zero otherwise.

Equation (1) may be used to determine a missing $Y_{i,t}$ by cross-imputing yield data observations for a location i and years other than a year t.

After the cross imputation of the missing yield data are completed, any grid in the field with observed yield values in at least one of the yield maps will have a full set of yield values in the yield maps for all years.

However, if a grid does not have a yield observation in any of the yield maps, then after performing the data imputation approach, the grid will still be missing a yield data record. Furthermore, applying a management zone delineation approach to the data in such a grid will not result in generating any zone label for the grid.

3.2.4 Empirical Cumulative Density Transformation

ECDF transformation may be used to transform the yield data into the transformed yield data. Application of ECDF to the yield data may cause transforming the yield data records to transformed yield data records, each of which falls within a particular range. Applying ECDF to the yield data causes normalizing the yield data so that the normalized yield data are comparable across different years and crops, such as corn, soy, and wheat.

In step 830, preprocessed data are transformed to result in creating and storing digitally transformed yield data. Transformed yield data may be generated by applying ECDF transformation to yield data records for each field and year to transform the data record values to a certain range of values. For example, ECDF transformation may be applied to yield data records to transform the data records to be within the range of [0, 1].

3.2.5 Spatial Smoothing

Data smoothing may be performed on either raw yield data or processed yield data. That depends on a quality of the received raw yield data and on the implementation.

In an embodiment, a spatial smoothing is performed to remove measurement noises in the raw yield observations and reduce unnecessary fragmentation of delineated management zones. The spatial smoothing may be performed using approaches such as a kernel-smoother, or a stationary Gaussian process.

A kernel smoother is a statistical technique for estimating a function by using its noise observations when no parametric model for the function is known. The resulting estimated function is usually smooth. The estimated smooth function may be used to remove the noise observations from a set of observations, such as the yield data.

In an embodiment, kernel smoothers that are reliable and useful nonparametric estimators are selected to perform a spatial smoothing of yield data. Examples of the kernel smoothers that can be used to smooth the yield data include a Gaussian kernel, an inverse distance weighting kernel, a rectangular kernel, a triangular kernel, a Bi-Square kernel, a tri-cube kernel, and a tri-weight kernel. Besides their standard parameterization, all of them are also equipped with a scale parameter h and a span parameter H such that the distance between yield data observations may be scaled and the observations that are more than H away from the destination point may be omitted in the smoothing process.

Referring again to FIG. 8, in step 840, smooth transformed yield data are generated by smoothing the transformed yield data. Smooth transformed yield data may be generated using any of the kernel estimators described above.

An example kernel estimator for determining a missing $Y_{i,t}$ yield data observation at a location i and a year t may be expressed using the following equation:

$$\hat{Y}_{i,t} = \{\Sigma_j K(d_{i,j}) Y_{j,t}\} * \{\Sigma_j K(d_{i,j})\} \quad (2)$$

where K is a kernel function selected from the examples described above, $Y_{j,t}$ is the yield data observation at a location j and a year t, and $d_{i,j}$ is the distance between a location i and a location j.

In an embodiment, a Gaussian kernel smoother is used in equation (2). In a Gaussian kernel smoother, parameters h and H can be either selected empirically based on experience with the data, or quantitatively optimized by cross validations.

In step 850, a test is performed to determine whether the obtained yield data are acceptable for subjecting it to a management zones delineation process. The test may include testing whether any yield data records are still missing, whether the yield data records need to be further smoothed, or whether certain yield data records need to be removed or interpolated.

If in step 850 it is determined that the obtained yield data are acceptable, then step 860 is performed. Otherwise, depending on the outcome of the test, any of steps 820, 830 or 840 is performed. For example, if obtained yield data needs to be further preprocessed, then step 820 is performed. If the obtained yield data needs to be transformed again, then step 830 is performed. If the obtained yield data needs to be smoothed again, then step 840 is performed. It is also possible that two or three steps of steps 820, 830 and 840 are performed.

3.2.6 Identifying Management Zones

In an embodiment, a management zones delineation process is performed for different values of a management class count. A management class refers to areas in a field that have relatively homogeneous yield limiting factors, but that are not restricted to be spatially contiguous. Concept-wise, several management zones which are spatially separated from each other could belong to the same management class and could be operated in the same manner. Even though a management zone and a management class are often used interchangeably, these two terms are distinguishable, especially in reference to the presented zone creation approach.

In an embodiment, a delineation process is executed first for a first count value of the management class count, and if the quality of the generated zones is for some reason inadequate, then the process may be repeated for a second count value of the class count, and so forth.

Referring again to FIG. 8, in step 860, a first count value for a management classes count of a plurality of management classes is determined. Selecting a first count value for the management classes may include selecting an optimal number of management classes for creating the zones.

An optimal number of management classes may be found using a variety of approaches. According to one approach, an optimal number of management classes is selected by using all years of training yield maps at once. In this approach, a clustering algorithm is applied to the smoothed training yield maps with different number of classes and for each class. Then a training zone-quality measure for each class numbers is determined and used to identify an optimal number of classes. An example of the measure is a measure that checks for compactness and separation of classes and for each class. The compactness and separation of the classes and for each class are examples of the qualities that are considered in determining the final zones.

According to another approach, an optimal number of management classes is selected by carrying out a leave-one-year-out cross-validation approach for training yield maps.

Once a first count value is determined for a count of a plurality of classes, a first set of management zones is generated in step 870. The first set of management zones may be generated, for example, using a management zones delineation process that is performed using either a clustering approach or a region merging approach. Examples of a clustering approach may include centroid-based multivariate clustering approaches, such as a K-means approach and a fuzzy C-means approach. Examples of a region merging approach may include agglomerative region merging approaches, such as a hierarchical region-based segmentation approach.

3.2.6.1 K-Means Approach

In an embodiment, a management zones delineation process is implemented using a K-means approach. K-means approach aims to partition a set of yield data observations into k clusters in which each observation belongs to the cluster with the nearest mean. Assume that $Y_{i,t}$ is the yield observation at location i in year t where i belongs to a set $\{1, 2, \ldots, T\}$.

Furthermore, assume that $Y_i = \{Y_{i,1}, Y_{i,2}, \ldots, Y_{i,T}\}$ A for any i=1, 2, . . . , n. Then, for a given k from a set $\{1, 2 \ldots n\}$, the K-means approach aims to find the k sets $S = \{S_1, S_2 \ldots S_k\}$ such that the within-set sum of squares is minimized, wherein "S" corresponds to the sum of squares. This may be expressed using the following equation:

$$\min_S \sum_{i=1}^n \sum_{j=1}^k (Y_i - \mu_j)^2 \mathbb{1}(Y_i \in S_j) \tag{3}$$

so that:

$$\sum_{j=1}^k \mathbb{1}(Y_i \in S_j) = 1, \forall i; \tag{4}$$

and $\mu_j = \frac{\sum_{i=1}^n Y_i \mathbb{1}(Y_i \in S_j)}{\sum_{i=1}^n \mathbb{1}(Y_i \in S_j)}, \forall j.$ One of the advantages of using the K-means approach in the management zone delineation process is its simplicity. One of the disadvantages of using the K-means approach is that it does not consider spatial locations of the yield data observations within the field. As a result, a direct output from K-means clustering is the management class labels of each pixel i, and some additional steps may be needed to identify spatially contiguous zones. Moreover, it is recommended to use well preprocessed yield maps before using the K-means approach. If the yield maps are insufficiently preprocessed, then the results produced by the K-means approach may include many fragmented small zones.

The k that belongs to a set $\{1, 2 \ldots, n\}$ corresponds to the first count value, and represents a number of management classes described above. The k parameter is also referred to as a tuning parameter in the K-means approach. When k increases, the within-set sum of squares in equation (3) decreases for the same set of data, and the within-class compactness increases. However, when k is increased above a certain threshold, the K-means approach may lead to over-segmentation of the field, and the within-class compactness may need to be balanced.

3.2.6.2 Fuzzy C-Means Approach

In an embodiment, a management zones delineation process is implemented using a fuzzy C-means approach. Fuzzy C-means, also called fuzzy K-means, is a fuzzy extension of the K-means approach. In the fuzzy C-means approach, instead of assigning a hard label to each observation $Y_i$, each observation may be assigned to more than one cluster with different membership levels.

Let assume that for a given k, from a set $\{1, 2 \ldots n\}$, the fuzzy C-means algorithm aims to find the centers $C = \{C_1, C_2, \ldots, C_k\}$ and a n×k membership matrix $U = [u_{ij}]$, where $u_{i,j}$ belongs to a set [0, 1] such that the following weighted sum of squares is minimized. This may be expressed using the following equation:

$$\min_{c,u} \sum_{i=1}^n \sum_{j=1}^k u_{i,j}^m \|Y_i - \mu_j\|^2 \tag{5}$$

where:

$$0 \le u_{i,j} \le 1, \forall i, j; \tag{6}$$

$$\sum_{j=1}^k u_{i,j} = 1, \forall i;$$

$$0 < \sum_{i=1}^n u_{i,j} < n, \forall j.$$

In the equation (5), $\|\cdot\|$ stands for norm, such as the Euclidean norm. The m is the fuzzifier with m≥1, and determines the level of cluster fuzziness. In general, the larger m results in fuzzier clusters and in the lower limit when m=1, and thus the fuzzy C-means approach degenerates to K-means approach. When there is no strong experimentation or domain knowledge, the common choice for m is 2.

Similar to K-means approach, the direct optimization for equation (5) may be difficult, and an iterative approach is often carried out to perform the optimization step by step. For example, C and U may satisfy the following relationship to be the optimal solution of equation (5):

$$C_j = \frac{\sum_{i=1}^{n} u_{i,j}^m Y_i}{\sum_{i=1}^{n} u_{i,j}^m}, \forall j; \quad (7)$$

where $$u_{i,j} = \frac{1}{\sum_{j=1}^{k}\left(\frac{\|Y_i - C_j\|}{\|Y_i - C_k\|}\right)^{\frac{2}{m-1}}}, \forall i, j. \quad (8)$$

In an embodiment, an iterative algorithm starts with a randomly initialized membership matrix $U=[u_{i,j}]$, and then repeatedly updates the cluster centers C and the membership matrix U based on equations (7)-(8), respectively, until their values converge. After that, the management class label for a pixel i may be determined as:

$$\arg \max_{j=1, \ldots, k} u_{i,j}. \quad (9)$$

In an embodiment, compared to the K-means approach, the computational complexity of the fuzzy C-means approach is slightly higher. However, upon assigning crisp management class labels at the end, the outputs generated by the K-means approach and the outputs generated by the fuzzy C-means approach may be very similar.

3.2.6.3 Region Merging Approach

In an embodiment, a management zones delineation process is programmed to use hierarchical region-based segmentation. In this approach, two zones are neighboring to each other if, and only if, at least one pair of pixels between the two zones are neighbors based on the nearest 4-neighbor rule.

In an embodiment, a dissimilarity score for neighboring zones is computed. When calculating the dissimilarity score for any two neighboring zones, a modified complete-link distance measure of their yield observations is adopted. For example, let $S_A$ and $S_B$ be the sets of pixels belonging to zone A and zone B, respectively. The dissimilarity score between zone A and zone B may be calculated as follows:

$$d_{A,B} = \text{Quantile}(\{\text{mean}_t|Y_{i,t}-Y_{j,t}|, s.t. \in S_A \& j \in S_B\}, 95\%) \quad (10)$$

Therefore, if the dissimilarity score between two zones A and B is $d_{A,B}$, then it means that 95% of the between-zone pairs of pixels have a difference no larger than $d_{A,B}$ absolute difference in their yield observations on average over all years.

In an embodiment, a hierarchical region-based segmentation approach is implemented using code instructions shown in Table 1, below:

TABLE 1

| Algorithm 1: The region merging algorithm for zone creation |
|---|
| Data: yield maps, dissimilarity threshold ϵ |
| Result: zone labels for each pixel |
| 1 begin |
| 2 \| Initialization: each pixel is one zone ; |
| 3 \| while more than one zone do |
| 4 \| \| calculate the dissimilarity score between each pair of |
| \| \| neighboring zones based on their yield observations ; |
| 5 \| \| let d = the minimum dissimilarity score; |
| 6 \| \| if d ≤ ϵ then |
| 7 \| \| \| merge the most similar pair of zones; |
| 8 \| \| \| update proximity relation of the zones; |
| 9 \| \| else |
| 10 \| \| \| return the current zone labels ; |
| 11 \| \| end |
| 12 \| end |
| 13 end |

Table 2 below summarizes and compares three management zones delineating approaches described above.

TABLE 2

| Algorithm | Input | Output | Tuning Parameter | Note |
|---|---|---|---|---|
| K-means | yield observations $\{Y_{i,t}\}$ | class labels | $k(k \in \{1, 2, \ldots, n\})$ | computationally fastest |
| Fuzzy C-means | yield observations $\{Y_{i,t}\}$ | class labels | $k(k \in \{1, 2, \ldots, n\})$ | similar output as K-means but slower |
| Region merging | yield observations $\{Y_{i,t}\}$; pixel spatial location | zone labels | $\epsilon(\epsilon \in [0, 1])$ | computationally slowest, finer tuning, spatially contiguous zones |

One of the advantages of the region merging approach is that it utilizes a spatial location of the yield observations when creating the management zones. The approach is expected to generate spatially contiguous zones naturally unless the dissimilarity threshold is set too strict or the yield maps are too rough. In addition, as the dissimilarity threshold e is a continuous tuning parameter, as opposed to k, which takes only positive integers in K-means or fuzzy C-means, the hierarchical region merging algorithm may have more flexibility to fine tune the resulting zone delineation, and satisfy the diverse needs from different growers.

Another advantage of the region merging approach is that the region merging algorithm generates zone labels directly without class labels.

However, although the region merging approach may not include additional processing to present management zones, some post processing of the zone properties may be recommended.

In step 880, a test is performed to determine whether a count of management classes is to be changed. If the count is to be changed, then step 890 is performed. Otherwise, step 895 is performed. A count of management classes corresponds to a tuning parameter described above.

In step 890, a second count value for a count of management classes from among a plurality of management classes is determined, and steps 870-880 are repeated for the second count value.

3.2.7 Post Processing

In an embodiment, a set of management zones is post-processed. Post-processing of the management zones may be performed for various reasons. Post-processing may be performed for example, to clean small isolated zones to make sure all zones are spatially contiguous and have reasonable sizes. Small isolated zones are the zones that may be too small to cause a crop grower to change his agricultural practices. Small isolated zones are also referred to as fragmented zones. Post-processing may also be performed to remove small isolated zones. Even with spatial smoothing of the yield maps during the yield data preprocessing phase, the set of management zones may include small isolated zones that may be difficult to manage individually.

In an embodiment, a test is performed to determine whether a size of a zone is smaller than a user-defined threshold s. If the size of the zone is smaller than the threshold s, then the zone is merged with its most similar neighboring large zone that is larger than the small zone. The zone/class label of the large zone may be assigned to the merged zone.

If the class labels are obtained from the K-means or fuzzy C-means approaches, however, then two additional steps may be performed. For example, before zone cleaning, a set of zones may be constructed based on the class labels and the spatial location of pixels so that the size and neighboring zones of each management zone may be identified. After the zone cleaning, the class labels may be recovered from the constructed set, and the additional zone merges may be performed.

Figure 9:
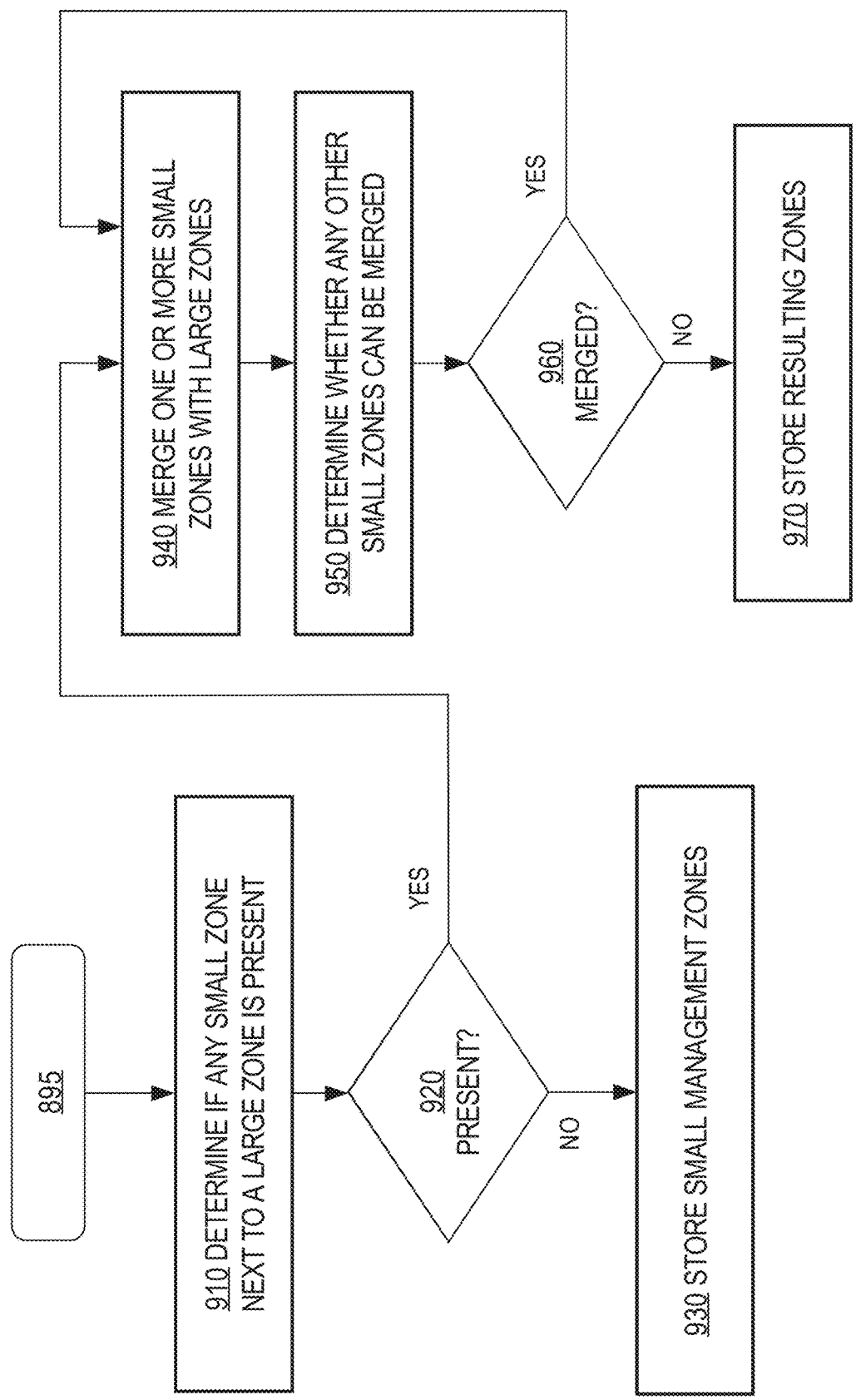
FIG. 9 depicts a method for management zones post-processing.

FIG. 9 depicts a method for management zones post-processing. In step 910, a test is performed to determine if any small zone next to a large zone is present in a set of management zones.

If in step 920 it is determined that no small zone next to a large zone is present in a set of management zones, then in step 930, the set of management zones is stored. The set of management zones may be stored in a storage device, a memory unit, a cloud storage service, or any other storage device. The set of management zones may be used to determine seeding recommendations for growers, for research purposes, and for providing information to other agencies.

However, if in step 920 it is determined that at least one small zone is present next to a large zone in a set of management zones, then, in step 940, the small zones are merged with their respective large zones.

A merging of the zones may be performed for each identified small zone, as indicated in steps 950-960. Once all identified small zones are merged with their respective large zones, in step 970 the resulting set of merged management zones is stored. The set of merged management zones may be stored in a storage device, a memory unit, a cloud storage service, or any other storage device. The set of management zones may be used to determine seeding recommendations for growers, for research purposes, and for providing information to other agencies.

3.3 Performance Considerations

Accuracy of the approach for delineating management zones in an agricultural field depends on a variety of factors. For example, assuming that the quality of the yield maps is comparable from year to year, the quality and accuracy of the management zones delineation increases proportionally to the number of yield maps from different years provided to the system. Hence, for a given field, the more years of yield maps are provided, the higher the quality and accuracy of management zones delineation may be.

3.4 Usefulness of Management Zones Delineation

Using the techniques described herein, a computer can determine a plurality of management zones based on digital data representing historical yields harvested from an agricultural field. The techniques herein can enable computers to determine the plurality of contiguous regions within an agricultural field that have similar limiting factors influencing the harvested yields of crops. The presented techniques can also enable the agricultural intelligence computing system to automatically determine the regions that belong to the same management zone and to generate recommendations for crop growers with respect to seeding, irrigation, application of fertilizers such as nitrogen, and/or harvesting.

Furthermore, the presented techniques can enable the agricultural intelligence computing system to save computational resources, such as data storage, computing power, and computer memory of the system, by implementing a programmable pipeline configured to automatically determine management zones for a field based on digital data. The programmable pipeline can automatically generate recommendations and alerts for farmers, insurance companies, and researchers, thereby allowing for a more effective agricultural management in the seeding schedules, operations of agricultural equipment, and application of chemicals to fields, protection of crops and other tangible steps in the management of agricultural field. Management zones created based on historical yield data may be particularly useful in certain agricultural practices, such as selecting a seeding rate. For example, information about the created management zones may be used to generate recommendations for crop growers. The recommendations may pertain to seed and seeding selections. Selecting a recommended seeding rate based on the identified management zones may be very helpful in increasing harvested yields.

3.5 Extensions

In an embodiment, a process of delineating management zones within an agricultural field is enhanced by taking into consideration not only the historical yield maps, but also weather forecast information. In this approach, the weather information may be used to provide explanations for inconsistencies in yield observations recorded in the historical yield maps.

A process of delineating management zones within a field may also be enhanced by providing information about soil properties and topographical properties of the field to the process. Usually, permanent soil and topographical properties play more important roles in determining sub-field yield variability than those transient factors such as weather.

Accuracy of the information about management zones may be further improved if the growers can provide sufficient historical yield data or sub-field yield maps to the system. Furthermore, accuracy of the information about management zones may be improved if the growers can provide the historical yield data in the required format and to the required input site.

What is claimed is:

1. A method comprising:
using instructions programmed in a computer system comprising one or more processors and computer memory, receiving, from physical sensors via a computer network, digital yield data representing yields of crops that have been harvested from an agricultural field;
using the instructions programmed in the computer system, transforming the digital yield data, by applying an empirical cumulative density function to the digital yield data, to generate transformed digital yield data;
based on the transformed digital yield data, using the instructions programmed in the computer system, smoothing and imputing, missing yield values to the transformed digital yield data to result in generating and storing smooth transformed digital yield data;
wherein imputing missing yield values to the transformed digital yield data comprises:
plotting the transformed yield data onto a virtual geometric digital grid constructed for the agricultural field and enclosed by boundaries of the agricultural field;
determining a particular grid, of the virtual geometric digital grid, that has no corresponding yield data record in the transformed digital yield data;
determining whether one or more yield data observations for a location corresponding to the particular grid are available in one or more observed yield value sets collected in one or more previous years;
in response to determining that one or more yield data observations for a location corresponding to the particular grid are available in One or more observed yield values sets collected in one or more previous years;
determining, using spatiotemporal modeling, a missing yield data record by cross imputing the one or more yield data observations for the location corresponding to the particular grid from the one or more observed yield value sets collected in one or more previous years; and
imputing the missing yield data record into the transformed digital yield data as the corresponding yield data record;
in response to determining that no yield data observations for the location corresponding to the particular grid is available in any observed yield value sets collected in previous years:
determining, for a plurality of neighboring grids that are adjacent to the particular grid, a plurality of neighboring yield data records from the transformed digital yield data;
determining, a plurality of weights for each of the neighboring yield data records;
computing a weighted sum based on the plurality of neighboring yield data records and the plurality of weights; and
imputing the weighted sum into the transformed digital yield data as the corresponding yield data record;
using the instructions programmed in the computer system, determining a first count value of a plurality of management classes, wherein the plurality of management classes includes areas in the agricultural field that have homogeneous yield limiting factors, but are not restricted to be spatially contiguous;
using the instructions programmed in the computer system, generating a plurality of first management zones for the agricultural field by clustering the smooth transformed digital yield data and using the first count value;
using the instructions programmed in the computer system, generating a set of first merged management zones by merging one or more small management zones, of the plurality of first management zones, with their respective similar neighboring large zones;
using the instructions programmed in the computer system, storing, in a computer-based database, the set of first merged management zones and the first count value, in a set of management zone metrics; and
using the instructions programmed in the computer system, automatically controlling, using the set of first merged management zones, a computer control system of one or more of seeding, irrigation, nitrogen application, and harvesting apparatus.

2. The method of claim 1, further comprising:
determining a second count value for the plurality of management classes;
generating a plurality of second management zones by clustering the smooth transformed digital yield data and using the second count value;
generating a set of second merged management zones by merging one or more small management zones, of the plurality of second management zones, with their respective similar neighboring large zones; and
storing the set of second merged management zones and the second count value in the set of management zone metrics.

3. The method of claim 2, further comprising: generating a management zone recommendation based on the set of management zone metrics by evaluating a delineation quality of management zones stored in the set of management zone metrics.

4. The method of claim 3, wherein the digital yield data comprise data representing yield information collected for a multi-year time period, and wherein the method further comprises determining a recommended class count for the plurality of management classes based on the set of management zone metrics.

5. The method of claim 3, wherein the digital yield data comprise data representing yield information collected for one year, and wherein the method further comprises determining a recommended class count for the plurality of management classes based on the set of Management zone metrics.

6. The method of claim 1, further comprising obtaining the digital yield data from a plurality of historical yield maps.

7. The method of claim 1, further comprising preprocessing the digital yield data by performing one or more of: removing yield maps that correspond to multiple crops planted in the same season in the agricultural field, removing yield maps that include yield records outside the boundaries of the agricultural field, marking yield records of absolute zeros as missing values, removing yield records for fields that have less than two years of yield maps, or removing yield maps that have more than a certain count of missing values.

8. The method of claim 1, further comprising using the empirical cumulative density function to transform the digital yield data into the transformed digital yield data including transformed digital yield data records, each of which falls in a particular range.

9. The method of claim 1, further comprising generating the smooth transformed digital yield data by performing one or more of: removing outliers data from the transformed digital yield data, determining one or more missing values in the transformed digital yield data and including the one or more missing values in the smooth transformed digital yield data, or performing a spatial smoothing on the transformed digital yield data.

10. The method of claim 1, wherein the set of first merged management zones includes contiguous subregions within the agricultural field that have homogeneous yield limiting factors and are uniformly managed; wherein the first count value for the plurality of management classes indicates a count of management classes in the plurality of management classes.

11. The method of claim 1, further comprising applying any one of: a K-means approach, a fuzzy C-means approach, or a region merging approach.

12. The method of claim 1, further comprising generating the set of first merged management zones by executing computer instructions to perform one or more of: applying hierarchical agglomeration; evaluating a delineation quality of management zones by applying one or more clustering validation measures to the set of management zone metrics.

13. A data processing system comprising:
a memory; and
one or more processors coupled to the memory and programmed to:
receive digital yield data representing yields of crops that have been harvested from an agricultural field;
transform the digital yield data, by applying an empirical cumulative density function to the digital yield data, to generate transformed digital yield data;
based on the transformed digital yield data, smooth the transformed digital yield data to result in generating and storing smooth transformed digital yield data;
wherein smoothing the transformed digital yield data comprises:
plotting the transformed digital yield data onto a virtual geometric digital grid constructed for the agricultural field and enclosed by boundaries of the agricultural field;
determining a particular grid, of the virtual geometric digital grid, that has no corresponding yield data record in the transformed digital yield data;
determining whether one or more yield data observations for a location corresponding to the particular grid are available in one or more observed yield value sets collected in one Or more previous years;
in response to determining that one or more yield data observations for a location corresponding to the particular grid are available in one or more observed yield value sets collected in one or more previous years:
determining, using spatiotemporal modeling, a missing yield data record by cross imputing, the one or more yield data observations for the location corresponding to the particular grid from the one or more observed yield value sets collected in one or more previous years; and
imputing the missing yield data record into the transformed digital yield data as the corresponding yield data record;
in response to determining that no yield data observations for the location corresponding to the particular grid is available in any observed yield value sets collected in previous years:
determining, for a plurality of neighboring grids that are adjacent to the particular grid, a plurality of neighboring yield data records from the transformed digital yield data;
determining, a plurality of weights for each of the neighboring yield data records;
computing a weighted sum based on the plurality of neighboring yield data records and the plurality of weights;
and imputing the weighted sum into the transformed digital yield data as the corresponding yield data record;
determine a first count value of a plurality of management classes, wherein the plurality of management classes includes areas in the agricultural field that have homogeneous yield limiting factors, but are not restricted to be spatially contiguous;
generate a plurality of first management zones for the agricultural field by clustering the smooth transformed digital yield data and using the first count value;
generate a set of first merged management zones by merging one or more small management zones, of the plurality of first management zones, with their respective similar neighboring large zones;
store the set of first merged management zones and the first count value in a set of management zone metrics; and
automatically control, using the set of first merged management zones, a computer control system of one or more of seeding, irrigation, nitrogen application, and harvesting apparatus.

14. The data processing system of claim 13, wherein the one or more processors are programmed to:
determine a second count value for the plurality of management classes;
generate a plurality of second management zones by clustering the smooth transformed digital yield data and using the second count value;
generate a set of second merged management zones by merging one or more small management zones, of the plurality of second management zones, with their respective similar neighboring large zones; and
store the set of second merged management zones and the second count value in the set of management zone metrics.

15. The data processing system of claim 14, wherein the one or more processors are programmed to: generate a management zone recommendation based on the set of management zone metrics by evaluating a delineation quality of management zones stored in the set of management zone metrics.

16. The data processing system of claim 13, wherein the digital yield data representing crop yields harvested from the agricultural field are is-obtained from a plurality of historical yield maps.

17. The data processing system of claim 13, wherein the digital yield data representing crop yields harvested from the agricultural field are preprocessed by performing one or more of: removing yield maps that correspond to multiple crops planted in the same season in the agricultural field, removing yield maps that include yield records outside the boundaries of the agricultural field, marking yield records of absolute zeros as missing values, removing yield records for fields that have less than two years of yield maps, or removing yield maps that have more than a certain count of missing values.

18. The data processing system of claim 13, wherein the empirical cumulative density function transforms the digital yield data to the transformed digital yield data including transformed digital yield data records, each of which falls in a particular range.

19. The data processing system of claim 13, wherein the smooth transformed digital yield data are generated by performing one or more of: removing outliers data from the transformed digital yield data, determining one or more missing values in the transformed digital yield data and including the one or more missing values in the smooth transformed digital yield data, or performing, a spatial smoothing on the transformed digital yield data.

* * * * *